United States Patent
Lee et al.

(10) Patent No.: US 9,793,514 B2
(45) Date of Patent: Oct. 17, 2017

(54) ORGANIC LIGHT EMITTING DIODE AND MANUFACTURING METHOD THEREFOR

(71) Applicant: SFC CO., LTD., Chungcheongbuk-do (KR)

(72) Inventors: Oun Gyu Lee, Chungcheongbuk-do (KR); Young Hwan Park, Chungcheongbuk-do (KR); Jeong Hyun Kim, Chungcheongbuk-do (KR); Jong Tae Je, Chungcheongbuk-do (KR)

(73) Assignee: SFC CO., LTD., Chungcheongbuk-Do (KR)

( * ) Notice: Subject to any disclaimer, the term of this patent is extended or adjusted under 35 U.S.C. 154(b) by 288 days.

(21) Appl. No.: 14/439,661

(22) PCT Filed: Oct. 22, 2013

(86) PCT No.: PCT/KR2013/009416
§ 371 (c)(1),
(2) Date: Apr. 29, 2015

(87) PCT Pub. No.: WO2014/069831
PCT Pub. Date: May 8, 2014

(65) Prior Publication Data
US 2015/0295205 A1    Oct. 15, 2015

(30) Foreign Application Priority Data

Oct. 31, 2012  (KR) .................. 10-2012-0122660
Jan. 25, 2013  (KR) .................. 10-2013-0008593

(51) Int. Cl.
*H01L 51/50* (2006.01)
*H01L 51/52* (2006.01)

(52) U.S. Cl.
CPC ...... *H01L 51/5271* (2013.01); *H01L 51/5234* (2013.01); *H01L 51/5265* (2013.01); *H01L 51/52* (2013.01); *H01L 2251/558* (2013.01)

(58) Field of Classification Search
CPC ...... H01L 51/5271; H01L 51/52; H01L 51/50
See application file for complete search history.

(56) References Cited

U.S. PATENT DOCUMENTS

| | | | |
|---|---|---|---|
| 5,814,416 A * | 9/1998 | Dodabalapur | H01L 51/5265 313/504 |
| 6,737,800 B1 * | 5/2004 | Winters | C09K 11/06 313/113 |
| 8,698,395 B2 * | 4/2014 | Im | H01L 51/5275 313/504 |
| 9,425,431 B2 * | 8/2016 | Yonehara | H01L 51/5234 |
| 9,583,736 B2 * | 2/2017 | Yonehara | H01L 51/5234 |

(Continued)

FOREIGN PATENT DOCUMENTS

| | | |
|---|---|---|
| JP | 2010-529598 A | 8/2010 |
| KR | 10-2004-0023781 A | 3/2004 |

(Continued)

OTHER PUBLICATIONS

International Search Report for PCT/KR2013/009416.

*Primary Examiner* — Rip A Lee
(74) *Attorney, Agent, or Firm* — The PL Law Group, PLLC

(57) ABSTRACT

The present invention relates to an organic light emitting diode and a manufacturing method therefor, and the organic light emitting diode comprises: a lower electrode formed on a light-transmitting substrate; an organic thin film layer which is formed on the lower electrode and includes a light-emitting layer; a light-transmitting upper electrode formed on the organic thin film layer; a functional layer which is formed on the upper electrode and enables mutual reinforcement and interference for the transmitted lights; and a reflective layer formed on the functional layer.

23 Claims, 4 Drawing Sheets

(56) References Cited

U.S. PATENT DOCUMENTS

| | | | | |
|---|---|---|---|---|
| 2003/0127974 A1* | 7/2003 | Miyazawa | H01L 51/0003 | 313/504 |
| 2003/0184219 A1* | 10/2003 | Duggal | H01L 51/5268 | 313/506 |
| 2004/0217681 A1* | 11/2004 | Park | H01L 51/52 | 313/110 |
| 2005/0076452 A1* | 4/2005 | Ouziel | D06P 1/5221 | 8/115.51 |
| 2006/0192471 A1* | 8/2006 | Inoue | H01L 51/5265 | 313/113 |
| 2006/0214572 A1* | 9/2006 | Maeda | H01L 51/5275 | 313/506 |
| 2007/0200123 A1* | 8/2007 | Yamamichi | H01L 27/3206 | 257/89 |
| 2009/0230845 A1* | 9/2009 | Kuma | H01L 51/5265 | 313/504 |
| 2010/0157585 A1* | 6/2010 | Diekmann | F21S 6/002 | 362/228 |
| 2011/0095675 A1* | 4/2011 | Oda | H01L 51/5265 | 313/499 |
| 2012/0200221 A1* | 8/2012 | Inoue | H01L 51/5271 | 313/504 |
| 2014/0110684 A1* | 4/2014 | Sugizaki | H01L 51/52 | 257/40 |

FOREIGN PATENT DOCUMENTS

| | | | | |
|---|---|---|---|---|
| KR | 10-2004-0049141 | * | 6/2004 | H05B 33/26 |
| KR | 10-2004-0049141 A | | 6/2004 | |
| KR | 10-0730221 B1 | | 6/2007 | |

* cited by examiner

ORGANIC LIGHT EMITTING DIODE AND MANUFACTURING METHOD THEREFOR

CROSS REFERENCE TO RELATED APPLICATIONS AND CLAIM OF PRIORITY

This patent application claims benefit under 35 U.S.C. 119(e), 120, 121, or 365(c), and is a National Stage entry from International Application No. PCT/KR2013/009416, filed 22 Oct. 2013, which claims priority to Korean Patent Application Nos. 10-2012-0122660, filed 31 Oct. 2012, and 10-2013-0008593, filed 25 Jan. 2013, the entire contents of which are incorporated herein by reference.

TECHNICAL FIELD

The present invention relates to an organic light emitting diode and, more particularly, to an organic light emitting diode, which may increase efficiency of light emitted from an organic emission material layer using reinforcement and interference of light and may exhibit high color quality and high luminance.

BACKGROUND ART

Organic light emitting diodes, which are a self-luminous device, are advantageous because of a wide viewing angle, high contrast, fast response time, high luminance, superior driving voltage, excellent response rate, and polychromatic properties.

Typical organic light emitting diodes are configured to include an organic emission material layer for emitting light, and a first electrode and a second electrode disposed on both sides of the organic emission material layer so as to face each other.

Such organic light emitting diodes are classified into a bottom emission type and a top emission type depending on the direction of light emitted from the organic emission material layer. A bottom emission type organic light emitting diode for emitting light to the substrate is configured such that a reflective electrode is formed on an organic emission material layer, and a transparent electrode is formed under the organic emission material layer. As such, when the organic light emitting diode operates in an active matrix mode, light does not pass through the portion thereof on which a thin film transistor is formed, thus reducing the area where light is transmitted. On the other hand, a top emission type organic light emitting diode is configured such that a transparent electrode is formed on an organic emission material layer and a reflective electrode is formed under the organic emission material layer, thus emitting light to a direction opposite the substrate, and thereby the area where light is transmitted is enlarged, resulting in high luminance.

The bottom emission type organic light emitting diode is configured such that an anode is formed on a substrate, and a hole transport layer, an emission material layer, an electron transport layer, and a cathode are sequentially formed on the anode. As such, the hole transport layer, the emission material layer, and the electron transport layer are organic thin films made of an organic compound.

The cathode comprises a metal layer having properties of a reflective layer, so that light generated from the emission material layer is reflected to the anode layer, thereby increasing luminous efficiency.

The driving principle of the organic light emitting diode thus configured is as follows. When voltage is applied between the anode and the cathode, holes injected from the anode are moved to the emission material layer via the hole transport layer, and electrons injected from the cathode are moved to the emission material layer via the electron transport layer. The carriers such as holes and electrons are re-combined in the emission material layer to form excitons. While these excitons return to a ground state from an excited state, light is produced.

As such, the generated light travels linearly to an anode direction, a cathode direction, and the other directions. The light traveling linearly to the anode is escaped to the air layer through glass, and the light traveling linearly to the cathode is reflected from the metal layer that is the cathode, and then goes again to the anode.

In this regard, Korean Patent Application Publication No. 10-2006-0095489 discloses an organic light emitting diode, which is configured such that an emission material layer is interposed between a first electrode and a second electrode, and a reflective layer for reflecting light emitted from the emission material layer to travel toward the second electrode is formed on the first electrode. Also, Korean Patent Application Publication No. 2001/0101640 discloses a technique for increasing luminous efficiency by determining the film thickness between a light-transmitting electrode and a reflective electrode so as to resonate the desired wavelength using interference caused by multiply reflecting light between the light-transmitting electrode and the reflective electrode.

FIG. 1 illustrates an organic light emitting diode manufactured by a conventional technique. Such a conventional technique is specified below.

In order to manufacture an organic light emitting diode, a soda-lime or alkali-free glass substrate 10 is coated with a transparent conductive film 20 (ITO), after which a photoresist (PR) is applied thereon using a spin coater, followed by UV exposure, thereby forming a desired pattern. Thereafter, the device is loaded on a vacuum deposition machine, and a hole injection layer (HIL) 30, a hole transport layer (HTL) 40, an emission material layer (EML) 50, an electron transport layer (ETL) 60 and a cathode (a metal electrode) 70 are deposited.

Then when direct-current power or voltage ranging from ones to tens of V is applied to the transparent electrode and the metal electrode to allow current to flow, the organic light emitting diode emits light, and light irradiated toward the cathode is reflected through a reflective plate, and is then irradiated toward the glass substrate.

As such, the reflected light may exhibit an interference effect with light that travels toward the anode from the emission material layer, but conventional organic EL (electroluminescent) devices have low constructive interference effects due to structural limitation thereof, making it impossible to obtain high color coordinates. To obtain color coordinates corresponding to high color quality of the organic light emitting diode, proper color coordinates may be ensured by using a material having low color coordinates or by adjusting the device thickness, but driving voltage, efficiency and lifetime may deteriorate undesirably.

SUMMARY

Therefore, the present invention has been made keeping in mind the problems encountered in the related art, and is intended to provide an organic light emitting diode having high color quality while increasing efficiency of light emitted from an organic emission material layer.

The present invention provides an organic light emitting diode, comprising: a lower electrode formed on a light-transmitting substrate; an organic thin film layer formed on the lower electrode and including an emission material layer; a light-transmitting upper electrode formed on the organic thin film layer; a functional layer formed on the upper electrode and enabling mutual reinforcement and interference of transmitted light; and a reflective layer formed on the functional layer.

In an embodiment, the organic light emitting diode may be configured to include an auxiliary electrode formed on the edge of the lower electrode.

In an embodiment, the lower electrode may be a conductive transparent electrode, and may have a thickness of 1~1000 nm.

In an embodiment, the upper electrode may have a transmittance of 10% or more and a resistance ranging from 0.1 mΩ to 500 Ω.

In an embodiment, the upper electrode may have a thickness of 1~1000 nm, and a material for the upper electrode may comprise copper, chromium, molybdenum, nickel, aluminum, magnesium, silver, gold, platinum, indium tin oxide (ITO), indium zinc oxide (IZO), zinc oxide (ZnO), $ZnO/Ga_2O_3$, $ZnO/Al_2O_3$, sodium, a sodium-potassium alloy, cesium, lithium, a magnesium-silver alloy, aluminum oxide, an aluminum-lithium alloy, indium, a rare earth metal, mixtures thereof with a material for an organic light emitting medium, and mixtures thereof with a material for an electron injection layer, which may be used alone or in combination of two or more.

In an embodiment, the functional layer may have a refractive index of 0.1~10, and a thickness of 1~1000 nm.

In an embodiment, the functional layer may comprise any one or a combination of an inorganic material including metal oxide or metal nitride; and an organic material selected from among a conductive organic material, a polymer compound, a mixture of a conductive organic compound and a polymer compound, a hole injection material, a hole transport material, an electron transport material, a host material, and a dopant material.

In an embodiment, the thickness of the functional layer or the light-transmitting upper electrode is adjusted, thereby controlling mutual reinforcement and interference of light emitted from the organic light emitting diode.

In an embodiment, the reflective layer may have a reflectance of 20% or more.

In an embodiment, the reflective layer may comprise any one or a combination of two more selected from among aluminum, magnesium, silver, gold, platinum, chromium, cobalt, tungsten, calcium, lithium, and sodium, and may have a thickness of 1~5000 nm.

In an embodiment, the organic thin film layer may comprise at least one selected from among a hole injection layer, a hole transport layer, an electron blocking layer, a functional layer having both a hole injection function and a hole transport function, an emission material layer, a hole blocking layer, an electron transport layer, and an electron injection layer. As such, mutual reinforcement and interference of light may be controlled by changing the thickness of at least one selected from among the hole injection layer, the hole transport layer, the electron blocking layer, the functional layer having both a hole injection function and a hole transport function, the emission material layer, the hole blocking layer, the electron transport layer, and the electron injection layer, which are included in the organic thin film layer.

In an embodiment, the emission material layer may emit light by combination of a host and a dopant.

In an embodiment, the reflective layer or the functional layer may be connected to the light-transmitting upper electrode by ohmic contact so as to reduce a resistance of the light-transmitting upper electrode.

In an embodiment, the organic light emitting diode may further comprise a capping layer formed between the lower electrode and the substrate or on an outer surface of the substrate to prevent total reflection of light, thereby increasing luminous efficiency of an organic emission material.

In an embodiment, the organic light emitting diode may comprise a blue emission material, a green emission material, or a red emission material, which emits light in a wavelength range of 380~800 nm, and the blue emission material, the green emission material, or the red emission material may be a fluorescent material or a phosphorescent material.

In addition, the present invention provides a method of manufacturing an organic light emitting diode, comprising: forming a lower electrode on a light-transmitting substrate; forming an organic thin film layer including an emission material layer on the lower electrode; forming a light-transmitting upper electrode on the organic thin film layer; forming a functional layer that enables mutual reinforcement and interference of transmitted light on the upper electrode; and forming a reflective layer on the functional layer.

The thickness of the functional layer or the light-transmitting upper electrode may be adjusted, thereby controlling mutual reinforcement and interference of light emitted from the organic light emitting diode.

In an embodiment, the organic thin film layer may comprise at least one selected from among a hole injection layer, a hole transport layer, an electron blocking layer, a layer having both a hole injection function and a hole transport function, an emission material layer, a hole blocking layer, an electron transport layer, and an electron injection layer.

As such, at least one selected from among the lower electrode, the organic thin film layer, the hole injection layer, the hole transport layer, the electron blocking layer, the functional layer having both a hole injection function and a hole transport function, the emission material layer, the hole blocking layer, the electron transport layer, the electron injection layer, the light-transmitting upper electrode, the functional layer, and the reflective layer may be formed by a deposition process or a solution process.

Also, mutual reinforcement and interference of light may be controlled by changing the thickness of at least one selected from among the hole injection layer, the hole transport layer, the layer having both a hole injection function and a hole transport function, the emission material layer, the hole blocking layer, the electron transport layer, and the electron injection layer.

In an embodiment, the functional layer may be formed by a deposition process or a solution process.

According to the present invention, an organic light emitting diode is configured such that an upper electrode, especially a light-transmitting upper electrode, is further provided on an organic thin film layer including an emission material layer, and then a functional layer and a reflective layer are sequentially formed thereon, thereby forming a device structure able to maximize constructive interference effects, ultimately exhibiting high color quality, high luminance, long lifetime, and high efficiency.

Also, the device structure according to the present invention has a simple manufacturing process and is easy to fabricate a large-area device, and enables the formation of a device having high process yield and high color reproducibility.

DETAILED DESCRIPTION

Hereinafter, a detailed description will be given of an organic light emitting diode according to embodiments of the present invention with reference to the appended drawings.

Figure 1:
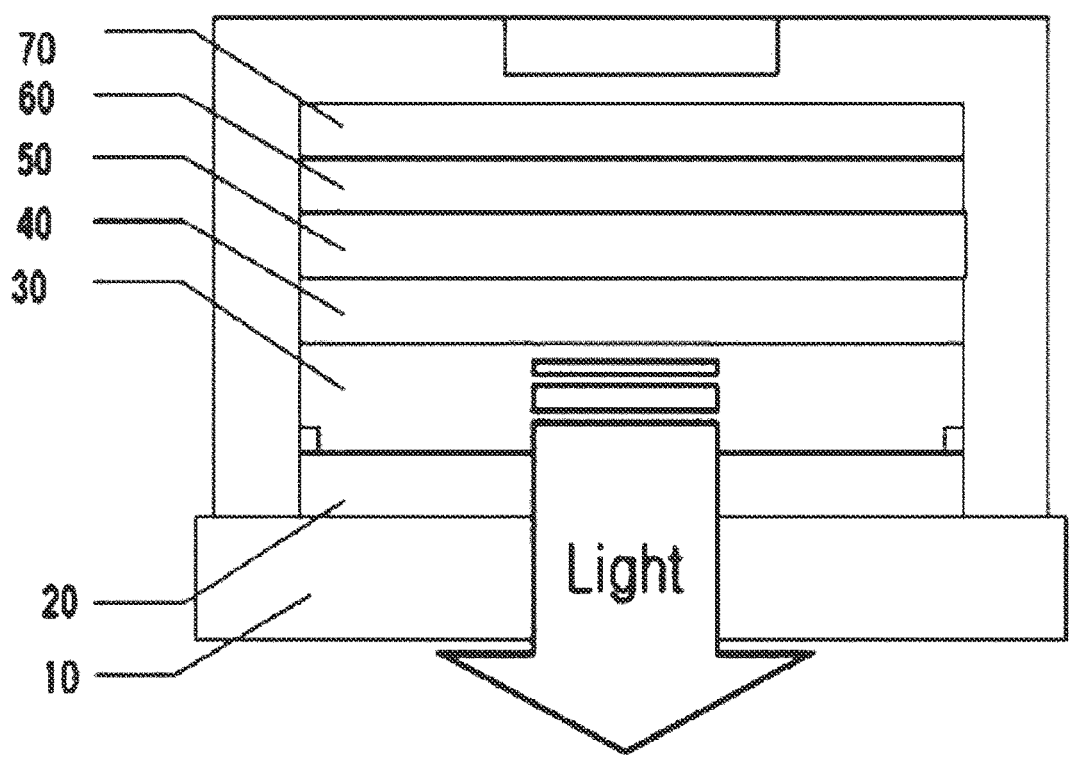
FIG. 1 illustrates the structure of a conventional organic light emitting diode.
Figure 2:
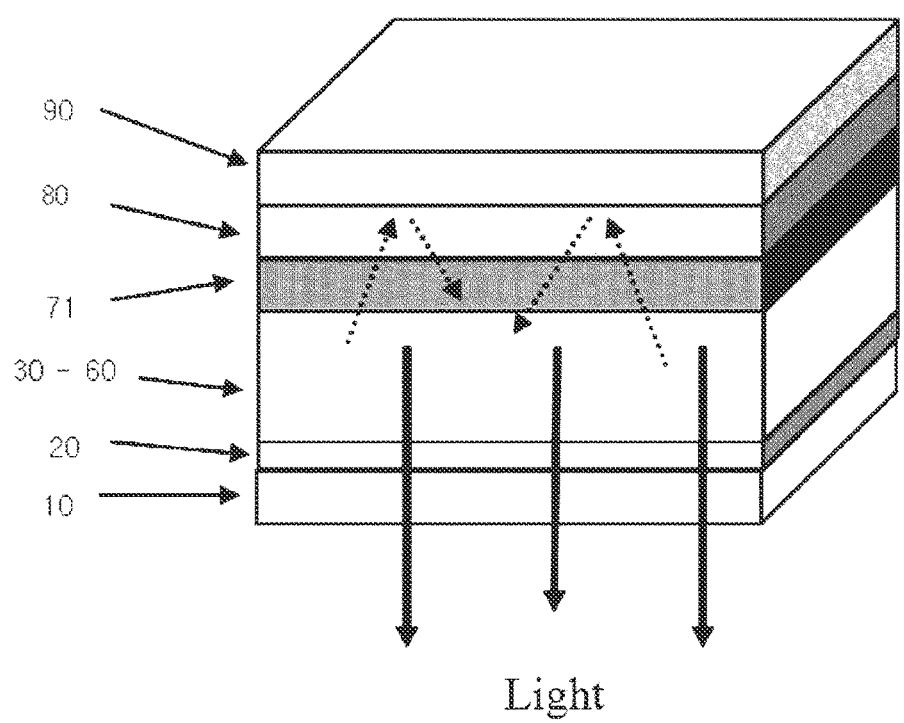
FIG. 2 illustrates the emission of an organic light emitting diode according to an embodiment of the present invention.

FIG. 2 illustrates the emission of an organic light emitting diode according to an embodiment of the present invention. As illustrated in FIG. 2, an organic light emitting display according to an embodiment of the present invention comprises: a lower electrode 20 formed on a light-transmitting substrate 10; an organic thin film layer 30~60 formed on the lower electrode 20 and including an emission material layer; a light-transmitting upper electrode 71 formed on the organic thin film layer; a functional layer 80 formed on the upper electrode 71 and enabling mutual reinforcement and interference of transmitted light; and a reflective layer 90 formed on the functional layer.

The substrate 10 is a light-transmitting and electrical insulating substrate made of glass or a polymer, and preferably has to possess superior mechanical strength or dimensional stability.

Such a substrate may be a substrate formed of an inorganic material, for example, a glass substrate, a metal substrate, or a ceramic substrate. Preferable examples of the inorganic material include glass, silicon oxide, aluminum oxide, titanium oxide, yttrium oxide, germanium oxide, zinc oxide, magnesium oxide, calcium oxide, strontium oxide, barium oxide, lead oxide, sodium oxide, zirconium oxide, lithium oxide, boron oxide, silicon nitride, soda-lime glass, barium strontium-containing glass, lead glass, aluminosilicate glass, borosilicate glass, and barium borosilicate glass.

Also, preferable examples of an organic material for the substrate include a polycarbonate resin, an acryl resin, a vinyl chloride resin, a polyethylene terephthalate resin, a polyimide resin, a polyester resin, an epoxy resin, a phenol resin, a silicone resin, a fluorine resin, a polyvinylalcohol resin, a polyvinylpyrrolidone resin, a polyurethane resin, an epoxy resin, a cyanate resin, a melamine resin, a maleic resin, a vinyl acetate resin, a polyacetal resin, and a cellulose resin.

Also, in order to prevent moisture from penetrating into an organic EL display, forming a larger number of inorganic films, applying a fluorine resin, or performing moisture proof treatment or hydrophobic treatment is preferably carried out on the substrate made of the material as above. Furthermore, to prevent the penetration of moisture into an organic light emitting medium, the water content of the substrate and the gas permeation coefficient preferably have to be decreased.

Below is a description of the upper electrode and the lower electrode. The lower electrode 20 is a light-transmitting electrode. Upon bottom emission, the lower electrode becomes an anode corresponding to a hole injection electrode, and the upper electrode 71 becomes a cathode corresponding to an electron injection electrode. However, embodiments of the present invention are not necessarily limited thereto, and the lower electrode 20 may become a cathode and the upper electrode 71 may becomes an anode, depending on the driving method of the organic light emitting diode.

When the lower electrode 20 is an anode, a preferable anode layer may be formed of a metal having high work function (e.g. 4.0 eV or more), an alloy, an electrically conductive compound, or mixtures thereof. Specific examples of the electrode material may include indium tin oxide (ITO), indium zinc oxide (IZO), indium copper (CuIn), tin oxide ($SnO_2$), zinc oxide (ZnO), gold, platinum, and palladium, which may be used alone or in combination of two or more. Such an electrode material may be formed into an anode layer having a uniform thickness by means of a film forming process in a dry state, such as vacuum deposition, sputtering, ion plating, e-beam deposition, CVD (Chemical Vapor Deposition), MOCVD (Metal Oxide Chemical Vapor Deposition), and plasma-enhanced CVD.

Also, the film thickness of the anode layer is not particularly limited, but is preferably 1~1000 nm.

The lower electrode 20 may be provided in the form of a single layer or a plurality of layers using a light-transmitting and conductive material, such as indium tin oxide (ITO), indium zinc oxide (IZO), tin oxide ($SnO_2$), or zinc oxide (ZnO), all of which are transparent and have high conductivity.

Holes and electrons are injected into the emission material layer from the lower electrode 20 and the upper electrode 71, respectively, and then combined together, thus forming excitons. When such excitons return to a ground state from an excited state, light is emitted from the organic emission material layer.

Also, an auxiliary electrode 25 may be formed of a metal component such as Cr, Mo, Al, Ag or alloys thereof on the edge of the lower electrode.

As the auxiliary electrode 25 is provided on the edge of the lower electrode using a metal component having low resistance, it functions to decrease the surface resistance of ITO for the anode to thereby ensure luminance uniformity even when the area of ITO is enlarged.

The auxiliary electrode formed on the lower electrode 20 may be formed by a process such as sputtering, thermal deposition, e-beam thermal deposition, or ion beam sputtering.

Also, an insulating film 27 may be formed on the lower electrode and the auxiliary electrode. The insulating film 27 may be formed of a polymer material or an inorganic material such as inorganic oxide.

Typical examples of the polymer material may include an acryl resin, a polycarbonate resin, a polyimide resin, a fluorinated polyimide resin, a benzoguanamine resin, a melamine resin, cyclic polyolefin, a novolac resin, vinyl cinnamate, cyclized rubber, a polyvinyl chloride resin, polystyrene, a phenol resin, an alkyd resin, an epoxy resin, a polyurethane resin, a polyester resin, a maleic acid resin, and a polyamide resin.

Also, the insulating film is formed of inorganic oxide. Preferable examples of the inorganic oxide include silicon oxide ($SiO_2$ or SiOx), aluminum oxide ($Al_2O_3$, AlON or AlOx), titanium oxide ($TiO_2$), yttrium oxide ($Y_2O_3$ or YOx), germanium oxide ($GeO_2$ or GeOx), zinc oxide (ZnO), magnesium oxide (MgO or MgOx), calcium oxide (CaO), boric acid ($B_2O_3$), strontium oxide (SrO), barium oxide (BaO), lead oxide (PbO), zirconia ($ZrO_2$), sodium oxide ($Na_2O$), lithium oxide ($Li_2O$), and potassium oxide ($K_2O$). In particular, when heat resistance is required, the material for the insulating film preferably includes an acryl resin, a polyimide resin, fluorinated polyimide, cyclic polyolefin, an epoxy resin, and an inorganic oxide.

Also, such an interlayer insulating film may be processed to a desired pattern by photolithography using a photosensitive group, or may be formed to a desired pattern by a printing process.

The thickness of the insulating film 27 varies depending on the processing conditions or the device requirements, and preferably ranges from 10 nm to 1 mm, more preferably from 100 nm to 100 μm, and much more preferably from 100 nm to 10 μm.

In the present invention, the organic thin film layer 30~60 may be provided on the lower electrode 20. As used therein, the term "organic thin film layer" refers to a single layer and/or a plurality of layers interposed between the first electrode and the second electrode of the organic light emitting diode. The organic thin film layer includes an emission material layer, and the emission material layer may contain an organic emission material including a host and a dopant.

In the present invention, the organic thin film layer 30~60 including an emission material layer may include at least one of a hole injection layer 30, a hole transport layer 40, a layer having both a hole injection function and a hole transport function (hereinafter referred to as a "H-functional layer"), a buffer layer, an electron blocking layer, an emission material layer 50, a hole blocking layer, an electron transport layer 60, an electron injection layer, and a layer having both an electron transport function and an electron injection function (hereinafter referred to as "E-functional layer").

The thickness of each layer in the organic thin film layer is not particularly limited, but preferably ranges from 5 nm to 5 μm. If the thickness of each layer is less than 5 nm, luminance or durability may deteriorate. In contrast, if the thickness thereof exceeds 5 μm, the applied voltage may be increased. Hence, the thickness of each layer preferably falls in the range of from 10 nm to 3 μm, and more preferably from 20 nm to 1 μm.

In the present invention, at least one selected from among the hole injection layer 30, the hole transport layer 40, the layer having both a hole injection function and a hole transport function, the buffer layer, the electron blocking layer, the emission material layer 50, the hole blocking layer, the electron transport layer 60, the electron injection layer, and the layer having both an electron transport function and an electron injection function may be formed by a single-molecule deposition process or a solution process.

As such, the deposition process is performed in such a manner that a material for each layer is evaporated through heating in a vacuum or under low pressure to form a thin film, and the solution process is performed in such a manner that a material for each layer is mixed with a solvent and then the mixture is subjected to inkjet printing, roll-to-roll coating, screen printing, spray coating, dip coating, or spin coating to form a thin film.

In the present invention, the organic light emitting diode may be used for any one selected from among a flat panel display; a flexible display; a solid color or white flat panel illuminator; and a solid color or white flexible illuminator.

The hole injection layer (HIL) may be formed on the lower electrode using any process such as vacuum deposition, spin coating, casting, or LB technique.

When the hole injection layer is formed by vacuum deposition, the deposition conditions may vary depending on the type of compound for use in the hole injection layer and on the structure and thermal properties of the hole injection layer, and may be selected from among, but are not limited to, for example, a deposition temperature of about 100~500° C., a vacuum level of about $10^{-8}$~$10^{-3}$ torr, and a deposition rate of about 0.01~100 Å/sec.

When the hole injection layer is formed by spin coating, the coating conditions may vary depending on the type of compound for use in the hole injection layer and on the structure and thermal properties of the hole injection layer, and may be selected from among, but are not limited to, for example, a coating rate of about 100~10000 rpm, and a thermal treatment temperature of about 50~300° C. for removal of the solvent after the coating process.

The material for the hole injection layer may include any known hole injection material, and examples of the known hole injection material may include, but are not limited to, N,N'-diphenyl-N,N'-bis-[4-(phenyl-m-tolyl-amino)-phenyl]-biphenyl-4,4'-diamine (DNTPD), a phthalocyanine compound such as copper phthalocyanine, m-MTDATA [4,4',4"-tris(3-methylphenylphenylamino) triphenylamine], NPB (N,N'-di(1-naphthyl)-N,N'-diphenylbenzidine)), TDATA, 2-TNATA (4,4',4"-tris(2-naphthylphenyl-phenylamino)-triphenylamine), Pani/DBSA (polyaniline/dodecylbenzenesulfonic acid), PEDOT/PSS (poly(3,4-ethylenedioxythiophene)/poly(4-styrenesulfonate), Pani/CSA (polyaniline/camphorsulfonic acid), and PANI/PSS (polyaniline/poly(4-styrenesulfonate).

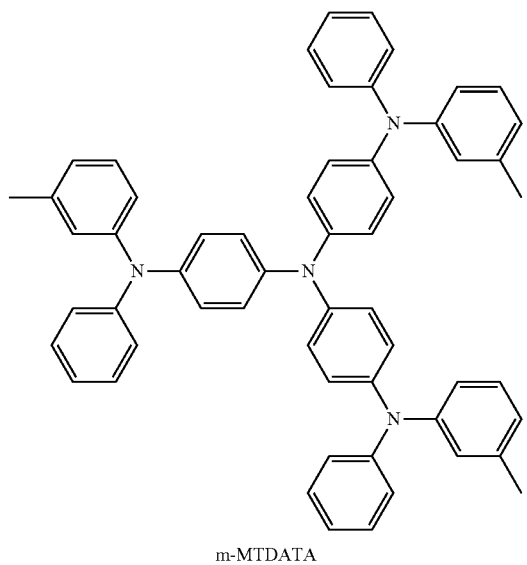

m-MTDATA

-continued

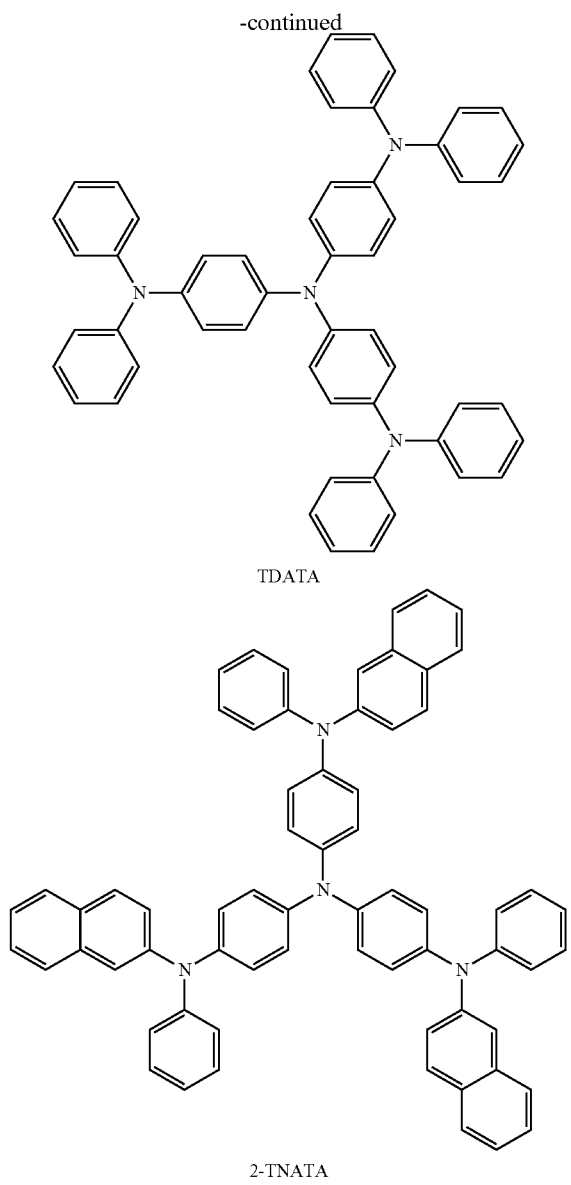

TDATA

2-TNATA

The thickness of the hole injection layer is about 1~1000 nm, and may be, for example, about 100~1000 Å. Given the above thickness range of the hole injection layer, satisfactory hole injection properties may be obtained without a substantial increase in driving voltage.

Next, the hole transport layer (HTL) may be formed on the hole injection layer using any process such as vacuum deposition, spin coating, casting, or LB technique. When the hole transport layer is formed by vacuum deposition or spin coating, the deposition conditions or the coating conditions may vary depending on the type of compound used, but may be generally selected from among almost the same conditions as in formation of the hole injection layer.

The material for the hole transport layer may include at least one of a styryl compound, a styryl-containing composition, and a known hole transport material. Examples of the known hole transport material may include, but are not limited to, carbazole derivatives such as N-phenylcarbazole and polyvinylcarbazole as represented by Compounds 101 to 104 below, N,N'-bis(3-methylphenyl)-N,N'-diphenyl-[1,1-biphenyl]-4,4'-diamine (TPD), TCTA (4,4',4''-tris(N-car-bazolyl)triphenylamine), NPB (N,N'-di(1-naphthyl)-N,N'-diphenylbenzidine)), and diarylamine represented by Compound 105 below.

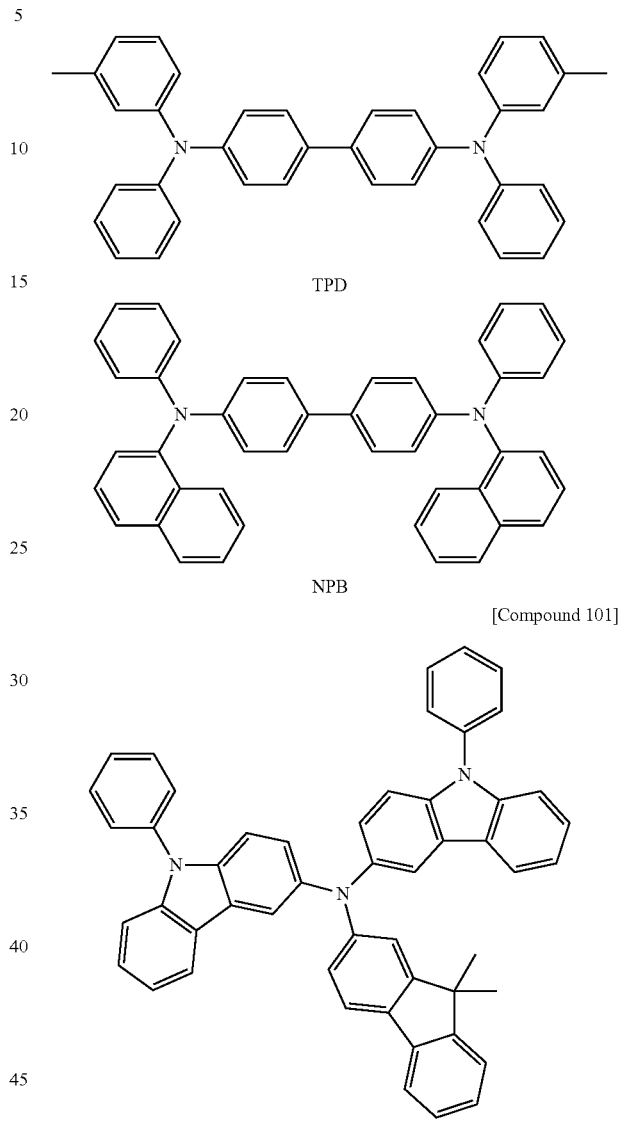

TPD

NPB

[Compound 101]

[Compound 102]

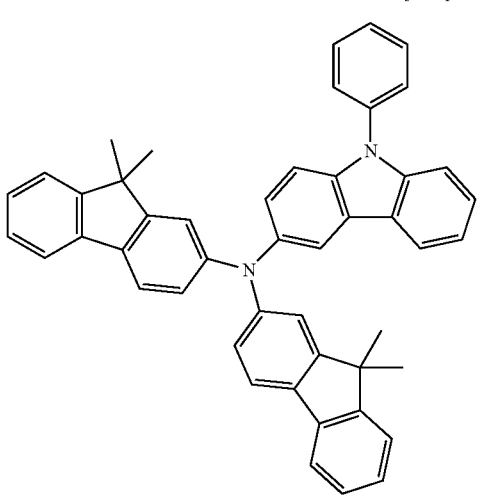

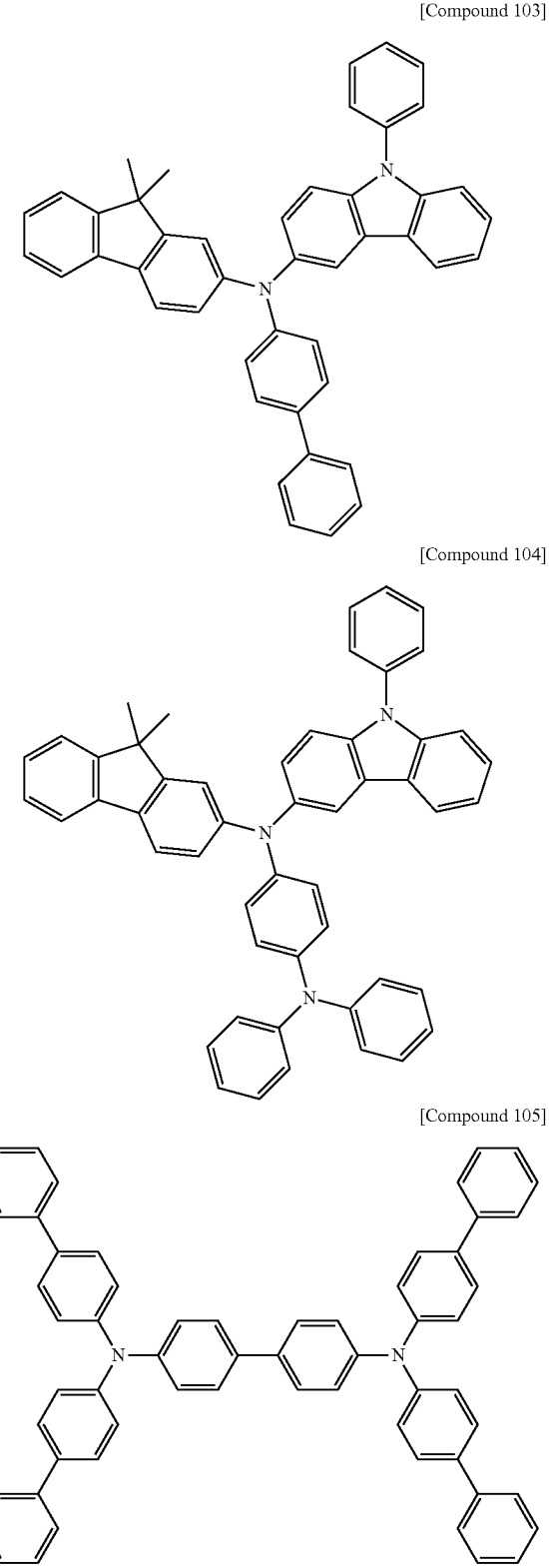

[Compound 103]

[Compound 104]

[Compound 105]

The thickness of the hole transport layer may be about 5~200 nm, for example, about 10~150 nm. Given the above thickness range of the hole transport layer, satisfactory hole transport properties may be obtained without a substantial increase in driving voltage.

The H-functional layer (a functional layer having a hole transport function) may include one or more of materials for the hole injection layer and the hole transport layer, and the thickness of the H-functional layer may be about 5~1000 nm, for example, about 10~100 nm. Given the above thickness range of the H-functional layer, satisfactory hole injection and transport properties may be obtained without a substantial increase in driving voltage.

At least one of the hole injection layer, the hole transport layer and the H-functional layer may be doped with a charge-generating material to enhance film conductivity or may further include a multi-layer, in addition to the known hole injection material, the known hole transport material and/or the material having both a hole injection function and a hole transport function as described above.

The charge-generating material may be exemplified by a p-dopant. The p-dopant may include, but is not limited to, any one of a quinine derivative, a metal oxide, and a cyano group-containing compound. Non-limited examples of the p-dopant may include, but are not limited to, a quinine derivative, such as tetracyano quinone dimethane (TCNQ), and 2,3,5,6-tetrafluoro-tetracyano-1,4-benzoquinone dimethane (F4-CTNQ); a metal oxide such as tungsten oxide and molybdenum oxide; and a cyano group-containing compound such as the following Compound 200.

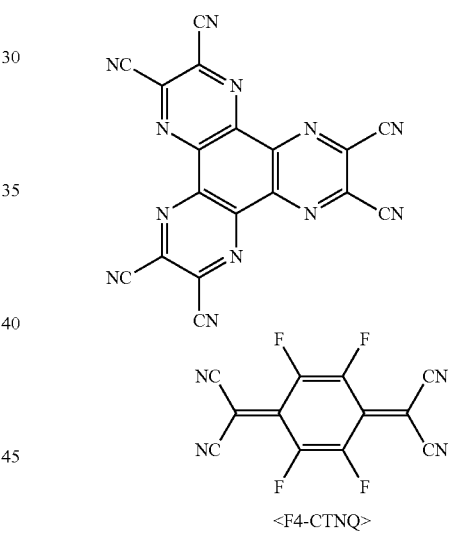

<Compound 200>

<F4-CTNQ>

When the hole injection layer, the hole transport layer or the H-functional layer further includes the charge-generating material, the charge-generating material may be variously applied in a manner that is homogeneously dispersed in the hole injection layer, the hole transport layer or the H-functional layer, or is heterogeneously distributed therein.

The buffer layer may be interposed between at least one of the hole injection layer, the hole transport layer and the H-functional layer, and the emission material layer. The buffer layer compensates for an optical resonance distance depending on the wavelength of light emitted from the emission material layer, and functions to confine electrons in the emission material layer to thus increase efficiency. The buffer layer may include the known hole injection material or hole transport material. Alternatively, the buffer layer may include the same material as any one of materials contained in the hole injection layer, the hole transport layer and the H-functional layer, which are formed under the buffer layer.

Subsequently, the emission material layer (EML) may be formed on the hole transport layer, the H-functional layer or the buffer layer, using a process such as vacuum deposition, spin coating, casting, or LB technique. When the emission material layer is formed by vacuum deposition or spin coating, the deposition conditions depends on the type of compound used, but may be generally selected from among almost the same conditions as in formation of the hole injection layer.

The emission material layer may include a dopant compound. Specific examples of the dopant may include, but are not limited to, a pyrene-based compound, arylamine, a peryl-based compound, a pyrrole-based compound, a hydrazone-based compound, a carbazole-based compound, a stilbene-based compound, a starburst-based compound, an oxadiazole-based compound, and coumarine.

The emission material layer may further include a host, in addition to the dopant compound.

Examples of the host may include, but are not limited to, Alq$_3$, CBP (4,4'-N,N'-dicarbazole-biphenyl), PVK (poly(n-vinylcarbazole)), 9,10-di(naphthalen-2-yl)anthracene (ADN), TCTA, TPBI (1,3,5-tris(N-phenylbenzimidazol-2-yl)benzene), TBADN (3-tert-butyl-9,10-di(napht-2-yl)anthracene), E3, DSA (distyrylarylene), and dmCBP (the following Formula).

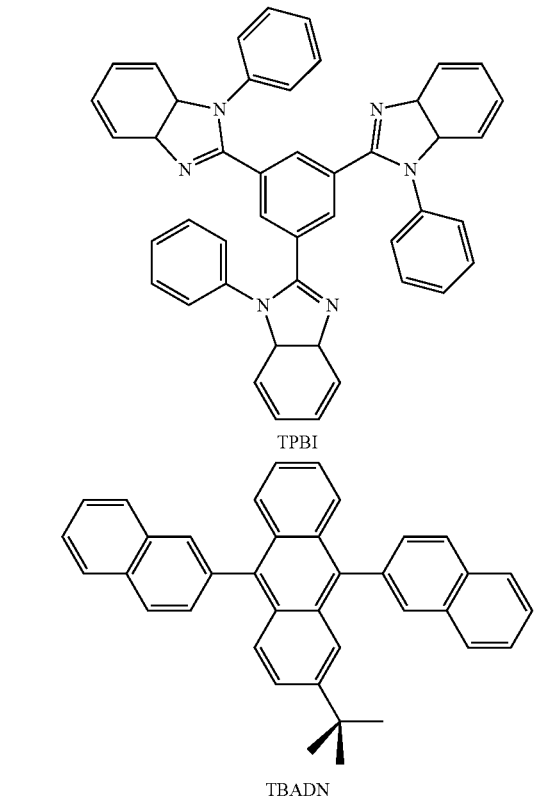

TPBI

TBADN

E3

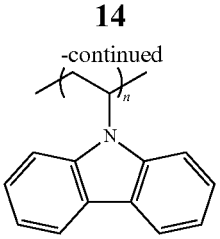

PVK ADN

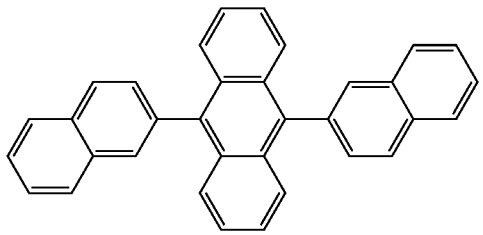

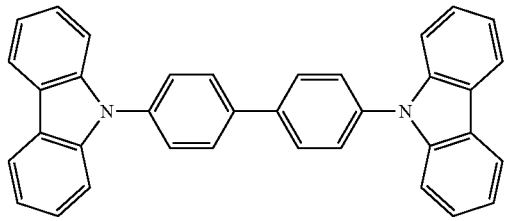

CBP

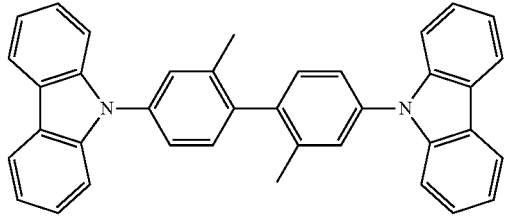

dmCBP

When the emission material layer includes the host and the dopant, the amount of the dopant may be typically set to, but is not limited to, the range of about 0.01~15 parts by weight, based on about 100 parts by weight of the host.

In the present invention, the host used for the emission material layer may be a compound represented by Formula 1A below.

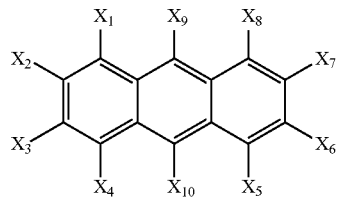

[Formula 1A]

In Formula 1A, $X_1$ to $X_{10}$ are identical to or different from each other and are each independently selected from among a hydrogen atom, a deuterium atom, a substituted or unsubstituted C1-C30 alkyl group, a substituted or unsubstituted C2-C30 alkenyl group, a substituted or unsubstituted C3-C30 cycloalkyl group, a substituted or unsubstituted C5-C30 cycloalkenyl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted C1-C30 alkylamine group, a substituted or unsubstituted C5-C30 arylamine group, a substituted or unsubstituted C5-C50 aryl group, a substituted or unsubstituted C3-C50 heteroaryl group having a heteroatom such as O, N or S, a substituted or unsubstituted silicon group, a substituted or unsubstituted boron group, a substituted or unsubstituted silane group, a carbonyl group, a phosphoryl group, an amino group, a nitrile group, a hydroxyl group, a nitro group, a halogen group, an amide group, and an ester group, and may form an aliphatic, aromatic, aliphatic hetero or aromatic hetero fused ring with an adjacent group.

As used herein, the term "substituted or unsubstituted" means that substitution is or is not carried out by at least one substituent selected from among a cyano group, a halogen group, a hydroxyl group, a nitro group, an alkyl group, an alkoxy group, an alkylamino group, an arylamino group, a heteroarylamino group, an alkylsilyl group, an arylsilyl group, an aryloxy group, an aryl group, a heteroaryl group, germanium, phosphorus, boron, hydrogen, and deuterium.

In the present invention, the anthracene derivative of Formula 1A may be a compound represented by Formula 1Aa below.

[Formula 1Aa]

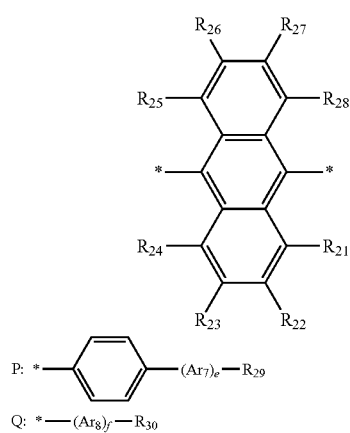

P: *—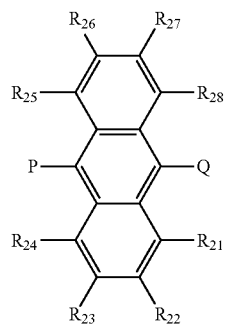—(Ar$_7$)$_e$—R$_{29}$

Q: *—(Ar$_8$)$_f$—R$_{30}$

In Formula 1Aa, Ar$_7$ and Ar$_8$ are identical to or different from each other and are each independently a substituted or unsubstituted C5-C60 aromatic linking group, or a substituted or unsubstituted C2-C60 heteroaromatic linking group; R$_{21}$ to R$_{30}$ are identical to or different from each other and each independently include the same substituents as defined in X$_1$ to X$_{10}$, and e and f are identical to or different from each other and are each independently 0 or an integer of 1 to 4, and two portions represented by * in the anthracene of Formula 1Aa are identical to or different from each other and may be each independently coupled with the above P or Q structure to form an anthracene-based derivative selected from among Formulas 1Aa-1 to 1Aa-3 below.

[Formula 1Aa-1]

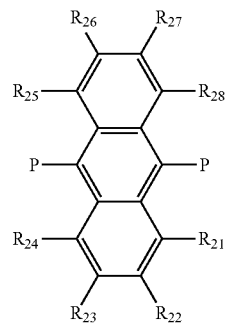

[Formula 1Aa-2]

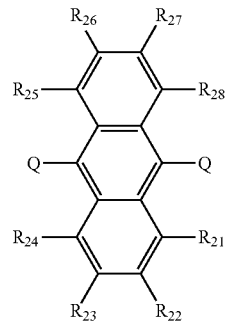

[Formula 1Aa-3]

As such, the term 'substituted' of 'substituted or unsubstituted' means that substitution is carried out by at least one substituent selected from among deuterium, a cyano group, a halogen group, a hydroxyl group, a nitro group, a C1-C24 alkyl group, a C1-C24 halogenated alkyl group, a C1-C24 alkenyl group, a C1-C24 alkynyl group, a C1-C24 heteroalkyl group, a C6-C24 aryl group, a C6-C24 arylalkyl group, a C2-C24 heteroaryl group, a C2-C24 heteroarylalkyl group, a C1-C24 alkoxy group, a C1-C24 alkylamino group, a C1-C24 arylamino group, a C1-C24 heteroarylamino group, a C1-C24 alkylsilyl group, a C1-C24 arylsilyl group, and a C1-C24 aryloxy group.

In the present invention, the dopant may be a compound represented by [Formula 2] or [Formula 3] below.

[Formula 2]

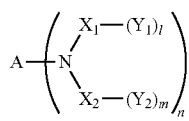

[Formula 3]

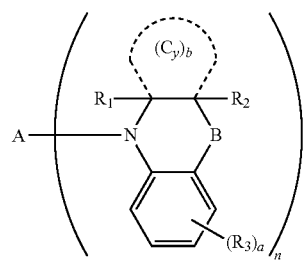

In [Formula 2] and [Formula 3],

A is an aromatic ring group having no heteroatom, especially a substituted or unsubstituted C6-C50 aromatic ring group; or an aromatic hetero ring group having a heteroatom such as O, N or S, especially a substituted or unsubstituted C2-C50 aromatic hetero ring group; and when n is 2 or more, amine groups linked to A may be identical to or different from each other.

When A is an aromatic ring group having no heteroatom, A preferably includes compounds represented by Formulas A1 to A10 below.

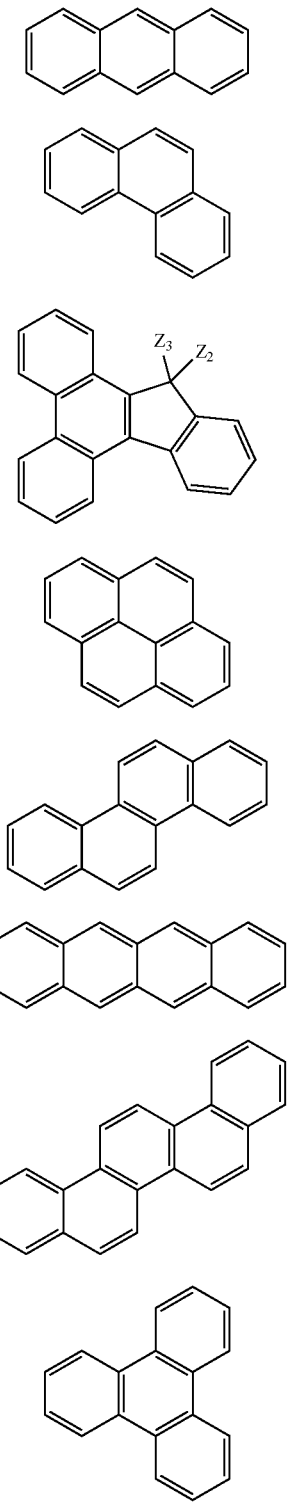

[Formula A1]
[Formula A2]
[Formula A3]
[Formula A4]
[Formula A5]
[Formula A6]
[Formula A7]
[Formula A8]

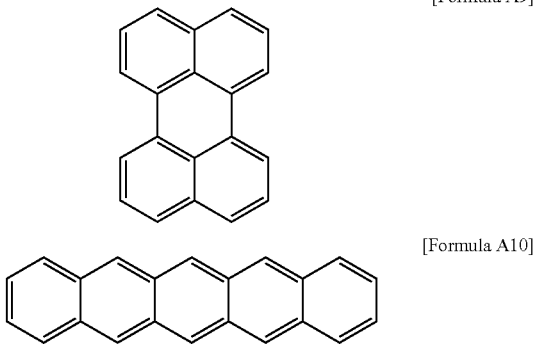

[Formula A9]
[Formula A10]

As such, $Z_1$ and $Z_2$ of [Formula A3] are each selected from among hydrogen, deuterium, a substituted or unsubstituted C1-C60 alkyl group, a substituted or unsubstituted C2-C60 alkenyl group, a substituted or unsubstituted C2-C60 alkynyl group, a substituted or unsubstituted C1-C60 alkoxy group, a substituted or unsubstituted C1-C60 alkylthio group, a substituted or unsubstituted C3-C60 cycloalkyl group, a substituted or unsubstituted C6-C60 aryl group, a substituted or unsubstituted C5-C60 aryloxy group, a substituted or unsubstituted C5-C60 arylthio group, a substituted or unsubstituted C2-C60 heteroaryl group, a substituted or unsubstituted C1-C60 (alkyl)amino group, a di(substituted or unsubstituted C1-C60 alkyl)amino group, a (substituted or unsubstituted C6-C60 aryl)amino group, and a di(substituted or unsubstituted C6-C60 aryl)amino group, and $Z_1$ and $Z_2$ are identical to or different from each other, and may form a fused ring with an adjacent group.

In [Formula 2], $X_1$ and $X_2$ are identical to or different from each other and are each independently a substituted or unsubstituted C6-C30 arylene group or a single bond, and $X_1$ and $X_2$ may be linked to each other; $Y_1$ and $Y_2$ are identical to or different from each other, and are each independently selected from among a substituted or unsubstituted C6-C24 aryl group, a substituted or unsubstituted C2-C24 heteroaryl group, a substituted or unsubstituted C1-C24 alkyl group, a substituted or unsubstituted C1-C24 heteroalkyl group, a substituted or unsubstituted C3-C24 cycloalkyl group, a substituted or unsubstituted C1-C24 alkoxy group, a cyano group, a halogen group, a substituted or unsubstituted C6-C24 aryloxy group, a substituted or unsubstituted C1-C40 alkylsilyl group, a substituted or unsubstituted C6-C30 arylsilyl group, germanium, phosphorus, boron, deuterium, and hydrogen, and may form an aliphatic, aromatic, aliphatic hetero or aromatic hetero fused ring with an adjacent group, l and m are each an integer of 1 to 20, and n is an integer of 1 to 4.

In [Formula 3], $C_y$ is a substituted or unsubstituted C3-C8 cycloalkyl, and b is an integer of 1 to 4, and when b is 2 or more, individual cycloalkanes may be provided in a fused form. Also, hydrogens substituted thereto may be substituted with deuterium or alkyl, and are identical to or different from each other, and B is a single bond or $-[C(R_5)(R_6)]_p-$, where p is an integer of 1 to 3. As such, when p is 2 or more, two or more $R_5$ and $R_6$ groups are identical to or different from each other; $R_1$, $R_2$, $R_3$, $R_5$ and $R_6$ may be independently selected from among hydrogen, deuterium, a halogen atom, a hydroxyl group, a cyano group, a nitro group, an amino group, an amidino group, hydrazine, hydrazone, a carboxyl group or salts thereof, sulfonic acid or salts thereof, phosphoric acid or salts thereof, a substituted or unsubstituted C1-C60 alkyl group, a substituted or unsubstituted C2-C60 alkenyl group, a substituted or unsubstituted C2-C60 alkynyl group, a substituted or unsubstituted C1-C60 alkoxy group, substituted or unsubstituted C1-C60 alkylthio group, a substituted or unsubstituted C3-C60 cycloalkyl group, a substituted or unsubstituted C6-C60 aryl group, a substituted or unsubstituted C5-C60 aryloxy group, a substituted or unsubstituted C5-C60 arylthio group, a substituted or unsubstituted C2-C60 heteroaryl group, a substituted or unsubstituted C1-C60 (alkyl)amino group, a di(substituted or unsubstituted C1-C60 alkyl)amino group, a (substituted or unsubstituted C6-C60 aryl)amino group, a di(substituted or unsubstituted C6-C60 aryl)amino group, a substituted or unsubstituted C1-C40 alkylsilyl group, and a substituted or unsubstituted C6-C30 arylsilyl group, and a is an integer of 1 to 4, in which when a is 2 or more, two or more $R_3$ groups are identical to or different from each other, and when a plurality of $R_3$ groups is provided, individual $R_3$ groups may be in a fused form, and n is an integer of 1 to 4.

In the present invention, the emission material layer may have a thickness of about 10~100 nm, for example, about 20~60 nm. Given the above thickness range of the emission material layer, superior emission properties may be exhibited without a substantial increase in driving voltage.

Next, the electron transport layer (ETL) is formed on the emission material layer using any process such as vacuum deposition, spin coating, or casting. When the electron transport layer is formed by vacuum deposition or spin coating, the processing conditions thereof may vary depending on the type of compound used, but may be typically selected from among almost the same conditions as in formation of the hole injection layer. The material for the electron transport layer may include any known electron transport material so long as it functions to stably transport electrons injected from the electron injection electrode (cathode). Examples of the known electron transport material may include, but are not limited to, a quinoline derivative, especially tris(8-quinolinolato)aluminum ($Alq_3$), TAZ, Balq, beryllium bis(benzoquinolin-10-olate) ($Bebq_2$), ADN, Compound 201, Compound 202, and oxadiazole derivatives such as PBD, BMD, and BND.

<Compound 201>

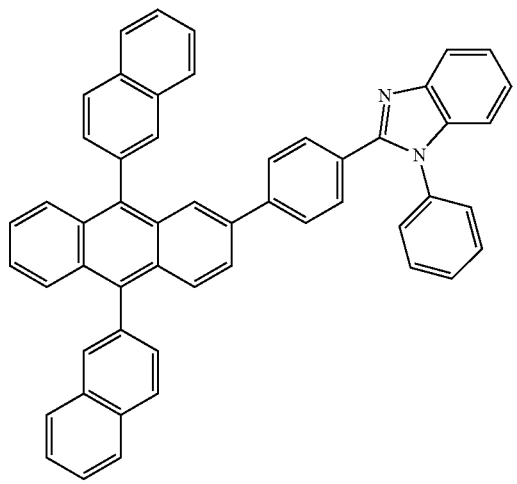

<Compound 202>

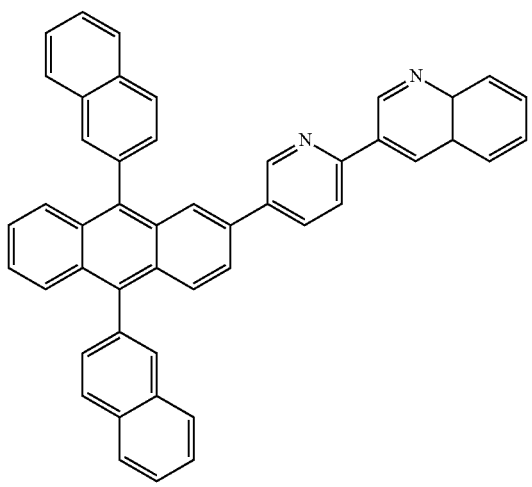

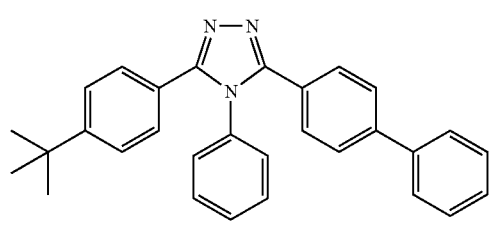

TAZ

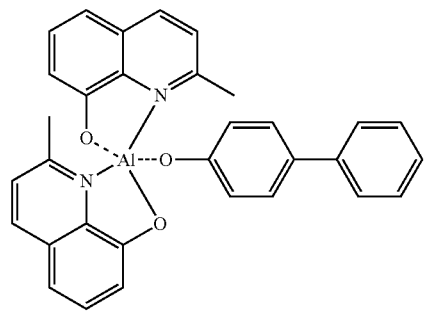

BAlq

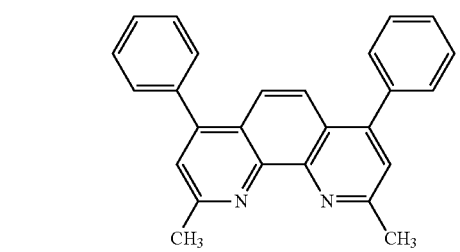

BCP

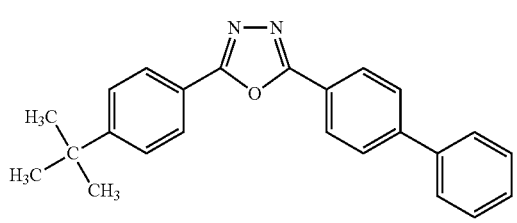

PBD

-continued

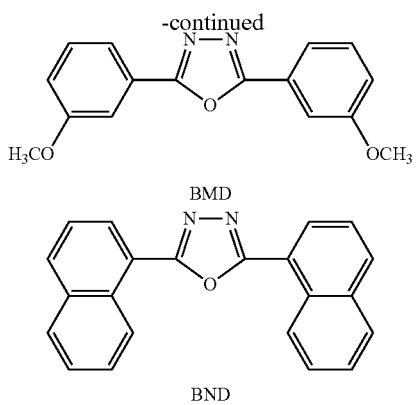

BMD

BND

The electron transport layer may have a thickness of about 10~100 nm, for example, about 15~50 nm. Given the above thickness range of the electron transport layer, satisfactory electron transport properties may be obtained without a substantial increase in driving voltage.

Alternatively, the electron transport layer may further include a metal-containing material, in addition to the known electron transportable organic compound.

The metal-containing material may include a Li, Cs, Na, or Ca complex. Non-limited examples of the Li complex may include lithium quinolate (LiQ) and Compound 203 below.

Compound 203

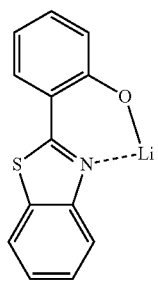

Also, the electron injection layer (EIL) comprising a material that facilitates the injection of electrons from the cathode may be formed on the electron transport layer, and the material thereof is not particularly limited.

The material for the electron injection layer may include any known electron injection material such as CsF, NaF, LiF, NaCl, Li$_2$O, or BaG. The deposition conditions of the electron injection layer may vary depending on the type of compound used, but may be typically selected from among almost the same conditions as in formation of the hole injection layer.

The electron injection layer may have a thickness of about 1 ~100 Å, for example, about 3~90 Å. Given the above thickness range of the electron injection layer, satisfactory electron injection properties may be obtained without a substantial increase in driving voltage.

Also, when a phosphorescent dopant or a fluorescent dopant is used for the emission material layer, triplet excitons or holes may be prevented from being diffused into the electron transport layer, and holes may be confined in the emission material layer, thus increasing efficiency. The hole blocking layer (HBL) may be formed between the hole transport layer and the emission material layer or between the H-functional layer and the emission material layer using a process such as vacuum deposition, spin coating, casting, or LB technique. When the hole blocking layer is formed by vacuum deposition or spin coating, the formation conditions thereof may vary depending on the type of compound used, but may be typically selected from among almost the same conditions as in formation of the hole injection layer. Any known hole blocking material may be used, and examples thereof may include an oxadiazole derivative, a triazole derivative, or a phenanthroline derivative. For example, the following BCP may be utilized as a material for the hole blocking layer.

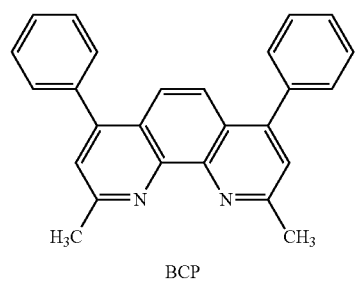 [SMILES: Cc1cc(-c2ccccc2)c2ccc3c(-c4ccccc4)cc(C)nc3c2n1 ; "BCP"]

BCP

The hole blocking layer may have a thickness of about 20~1000 Å, for example, about 30~300 Å. Given the above thickness range of the hole blocking layer, superior hole blocking properties may be attained without a substantial increase in driving voltage.

In the present invention, the upper electrode 71 may be composed of a metal having low work function, an alloy, an electrically conductive compound, or inclusions or mixtures thereof.

The upper electrode 71 has to possess high conductivity and light-transmitting properties because it should pass the emitted light through the functional layer.

The upper electrode has a transmittance of at least 10%, preferably at least 20%, more preferably at least 30%, even more preferably at least 40%, still more preferably at least 50%, yet more preferably at least 60%, yet still more preferably at least 70%, much more preferably at least 80%, and most preferably at least 90%.

The upper electrode may have a resistance ranging from 0.1 mΩ to 500Ω, and preferably from 1 mΩ to 100Ω.

Specific examples of the material for the upper electrode may include copper, chromium, molybdenum, nickel, aluminum, magnesium, silver, gold, platinum, indium tin oxide (ITO), indium zinc oxide (IZO), zinc oxide (ZnO), ZnO/Ga$_2$O$_3$, ZnO/Al$_2$O$_3$, sodium, a sodium-potassium alloy, cesium, magnesium, lithium, a magnesium-silver alloy, aluminum oxide, an aluminum-lithium alloy, indium, a rare earth metal, mixtures thereof with a material for an organic light emitting medium, and mixtures thereof with an electron injection material, which may be used alone or in combination of two or more.

Preferable examples of the material for the upper electrode include magnesium (Mg), aluminum (Al), aluminum-lithium (Al—Li), calcium (Ca), magnesium-indium (Mg—In), and magnesium-silver (Mg—Ag).

The film thickness of the upper electrode layer is not particularly limited, but is preferably set to 1~1,000 nm, and more preferably 1~200 nm, and the upper electrode may be formed of any material having a reflective index of 0.1~10.

The upper electrode 71 may be formed using a typical process, but is subjected to vacuum deposition or spin coating in order to minimize deterioration due to thermal damage to the previously deposited organic thin film layer. Specifically, a reduction in lifetime due to thermal damage to the organic thin film layer caused by sputtering at high temperature may be minimized.

In the present invention, when the functional layer is conductive, it is connected to the light-transmitting upper electrode so that conductivity of the upper electrode may become good.

The functional layer is preferably made of a material having high light-transmitting properties to reduce loss of light transmission.

The material for the functional layer preferably has low light absorption properties so as to decrease light loss.

Examples of the material for the functional layer may include, but are not limited to, any one or a combination of two or more selected from among an inorganic material including metal oxide or metal nitride; and an organic material including a conductive organic material, a polymer compound, a mixture of a conductive organic compound and a polymer compound, a hole injection material, a hole transport material, an electron transport material, a host material, and a dopant material.

The metal oxide or metal nitride as the inorganic material may include oxides or nitrides of metal such as In, Sn, Zn, Ti, Zr, Hf, V, Mo, Cu, Ga, Sr, La, or Ru, and specific examples thereof may include conductive or insulating transparent materials, such as ITO, IZO, AZO, SnOx, SiNx, ZnOx, TiN, ZrN, HfN, TiOx, $Nb_2O_5$, VOx, MoOx, CuI, InN, GaN, $TiO_2$, $CuAlO_2$, $CuGaO_2$, $SrCu_2O_2$, $LaB_6$, and RuOx.

Useful as the organic material, the conductive organic material may include a synthetic polymer having hole transport capability selected from among PEDOT/PSS (poly(3,4-ethylenedioxythiophene)/polystyrene parasulfonate), a starburst-based material, arylamine, perylene, carbazole, hydrazone, stilbene, and pyrrole; or a mixture including a polymer and a low-molecular weight compound having hole transport capability dispersed in the polymer, the polymer comprising at least one selected from among polystyrene, a poly(styrene-butadiene) copolymer, polymethylmethacrylate, polyalphamethylstyrene, a styrene-methylmethacrylate copolymer, polybutadiene, polycarbonate, polyethylterephthalate, polyester sulfonate, polyarylate, fluorinated polyimide, a transparent fluorine resin, and a transparent acryl resin, and the low-molecular weight compound comprising at least one selected from among arylamine, phenylene, carbazole, stilbene, pyrrole, and starburst compounds having derivatives thereof. Also useful is an oxazole-based compound, an isoxazole-based compound, a triazole-based compound, an isothiazole-based compound, an oxadiazole-based compound, a thiadiazole-based compound, a perylene-based compound, or an aluminum complex (e.g. $Alq_3$ (tris(8-quinolinolato)-aluminium), BAlq, SAlq, $Almq_3$, and a gallium complex (e.g. Gaq'2OPiv, Gaq'2OAc, 2(Gaq'2)).

Useful as the organic material in the present invention are a hole injection material, including N,N'-diphenyl-N,N'-bis-[4-(phenyl-m-tolyl-amino)-phenyl]-biphenyl-4,4'-diamine (DNTPD), a phthalocyanine compound such as copper phthalocyanine, m-MTDATA [4,4',4"-tris(3-methylphenyl-phenylamino)triphenylamine], NPB (N,N'-di(1-naphthyl)-N,N'-diphenylbenzidine)), TDATA, 2-TNATA, Pani/DBSA (polyaniline/dodecylbenzenesulfonic acid), PEDOT/PSS (poly(3,4-ethylenedioxythiophene)/poly(4-styrenesulfonate)), Pani/CSA (polyaniline/camphorsulfonic acid), and PANI/PSS (polyaniline/poly(4-styrenesulfonate)); a hole transport material, including a carbazole derivative such as N-phenylcarbazole or polyvinylcarbazole, N,N'-bis(3-methylphenyl)-N,N'-diphenyl-[1,1-biphenyl]-4,4'-diamine (TPD), TCTA (4,4',4"-tris(N-carbazolyl)triphenylamine), and NPB (N,N'-di(1-naphthyl)-N,N'-diphenylbenzidine); an electron transport material, including a quinoline derivative, especially tris(8-quinolinolato)aluminum ($Alq_3$), TAZ, Balq, beryllium bis(benzoquinolin-10-olate) ($Bebq_2$), and ADN; a dopant material, including a pyrene-based compound, arylamine, a peryl-based compound, a pyrrole-based compound, a hydrazone-based compound, a carbazole-based compound, a stilbene-based compound, a starburst-based compound, an oxadiazole-based compound, and coumarine; and a host material, including $Alq_3$, an anthracene-based compound, CBP (4,4'-N,N'-dicarbazole-biphenyl), PVK (poly(n-vinylcarbazole)), TCTA, TPBI (1,3,5-tris(N-phenyl-benzimidazol-2-yl)benzene)), E3, DSA (distyrylarylene), and dmCBP.

Typical examples of the polymer compound as the organic material may include an acryl resin, a polycarbonate resin, a polyimide resin, a fluorinated polyimide resin, a benzoguanamine resin, a melamine resin, cyclic polyolefin, a novolac resin, vinyl cinnamate, cyclized rubber, a polyvinyl chloride resin, polystyrene, a phenol resin, an alkyd resin, an epoxy resin, a polyurethane resin, a polyester resin, a maleic acid resin, and a polyamide resin.

Also useful for the functional layer of the invention is a mixture of the conductive organic material and the polymer compound as described above.

The functional layer 80 may be processed to a desired pattern by photolithography using a photosensitive group, and is preferably formed by vacuum deposition or spin coating in order to minimize deterioration due to thermal damage to the previously deposited organic thin film layer.

The thickness of the functional layer 80 may vary depending on the processing conditions or the device requirements, but preferably ranges from 0.5 nm to 1 mm, more preferably from 1 nm to 100 μm, and much more preferably from 10 nm to 10 μm.

The functional layer has to possess light-transmitting properties, and the light transmittance thereof is preferably set to 5~100%.

In the present invention, the reflective layer 90 plays a role in reflecting light passed through the functional layer after having been emitted from the organic thin film layer.

The reflective layer has a reflectance of at least 20%, preferably at least 30%, more preferably at least 40%, even more preferably at least 50%, still more preferably at least 60%, yet more preferably at least 70%, much more preferably at least 80%, and most preferably at least 90%.

The reflective layer is composed of any one or a combination of two more selected from among aluminum, magnesium, silver, gold, platinum, chromium, cobalt, tungsten, calcium, lithium, and sodium. Preferably useful is Al or Ag.

The film thickness of the reflective layer is not particularly limited, but is set to the range of 1~5000 nm, and preferably 10~300 nm so as to achieve device slimness.

The upper electrode 90 may be formed by a typical process, but is subjected to vacuum deposition or spin coating in order to minimize deterioration due to thermal damage to the previously deposited organic thin film layer.

Also in the present invention, a capping layer may be provided between the lower electrode layer and the substrate layer, or on the outer surface of the substrate layer, in order to maximize luminous efficiency of each of R, G, and B color coordinates of the emission material. The capping layer may be formed of an organic material or an inorganic material.

The organic material or the inorganic material used for the capping layer may have a refractive index of 1~10, so that the total reflection of light may be blocked when light passes through the interfaces composed of different components to thereby increase luminous efficiency of R, G, and B. The capping layer may be formed to a thickness of 1~120 nm.

In the present invention, the organic light emitting diode includes a blue emission material, a green emission material, or a red emission material, which emits light in the wavelength range of 380~800 nm, and the blue emission material, the green emission material, or the red emission material may be a fluorescent material or a phosphorescent material.

Also, a wiring unit for driving the organic light emitting diode may be provided on the substrate. The wiring unit includes switching and driving thin film transistors (not shown), and gives a signal for emitting light from the organic emission material, thereby driving the organic light emitting diode.

The wiring unit may further include a gate line arranged in one direction of the substrate 10, a data line that intersects the gate line so as to be electrically insulated therefrom, and a common power line.

In addition, the present invention addresses a method of manufacturing the organic light emitting diode, comprising: forming a lower electrode on a light-transmitting substrate; forming an organic thin film layer including an emission material layer on the lower electrode; forming a light-transmitting upper electrode on the organic thin film layer; forming a functional layer that enables mutual reinforcement and interference of transmitted light on the upper electrode; and forming a reflective layer on the functional layer.

As such, the functional layer may be formed by a deposition process or a solution process.

The deposition process means that a material for the functional layer is evaporated by a heating source to form a functional layer on the substrate, and the solution process means that a material for the functional layer is dissolved in a solvent and then undergoes spin coating or printing on the substrate to form a functional layer.

In the present invention, the organic thin film layer may include at least one selected from among a hole injection layer, a hole transport layer, an electron blocking layer, a functional layer having both a hole injection function and a hole transport function, an emission material layer, a hole blocking layer, an electron transport layer, and an electron injection layer.

As such, at least one of the lower electrode, the organic thin film layer, the light-transmitting upper electrode, the functional layer, and the reflective layer may be formed by a solution process.

In an embodiment, an organic light emitting display including the organic light emitting diode according to the present invention may include a switching thin film transistor, a driving thin film transistor, a storage capacitor, and an organic light emitting diode, each of which is formed per pixel.

Also as a sealing member for excluding a moisture effect in air, a moisture absorbent 95 may be provided at the top of the organic light emitting diode corresponding to a position opposite the substrate, thereby absorbing moisture that is incorporated in the course of forming the organic light emitting diode or that is penetrated from the outside.

Below is a description of the operation of the organic light emitting diode according to the present invention.

When voltage is applied between the lower electrode 20 formed on the light-transmitting substrate 10 and the light-transmitting upper electrode 71 formed on the organic thin film layer, holes injected from the anode as the lower electrode are moved to the emission material layer via the hole transport layer, and electrons injected from the cathode as the upper electrode are moved to the emission material layer via the electron transport layer. The carriers such as holes and electrons are re-combined in the emission material layer region to produce excitons. While such excitons return to a ground state from an excited state, light is generated.

As such, the generated light travels linearly to an anode direction, a cathode direction, and the other directions. Specifically, light traveling linearly toward the anode is escaped to the air layer through glass. On the other hand, light traveling linearly toward the cathode is irradiated onto the upper electrode through the light-transmitting upper electrode 71, passes through the functional layer 80 that enables mutual reinforcement and interference of transmitted light, is reflected by the reflective layer 90 formed on the functional layer, and sequentially passes through the functional layer and the upper electrode to travel toward the substrate, and is thus emitted later compared to light traveling linearly toward the anode.

As such, light reflected by the reflective layer 90 may cause constructive or destructive interference with light traveling linearly toward the anode by means of the functional layer and the organic thin film layer, both of which have a controlled thickness, thereby regulating the spectrum characteristics. Due to the interference effect of light, the organic light emitting diode according to the present invention enables the spectrum of emitted light to have a sharp peak at a specific wavelength, resulting in an organic light emitting diode having high color quality and high efficiency.

Figure 3:
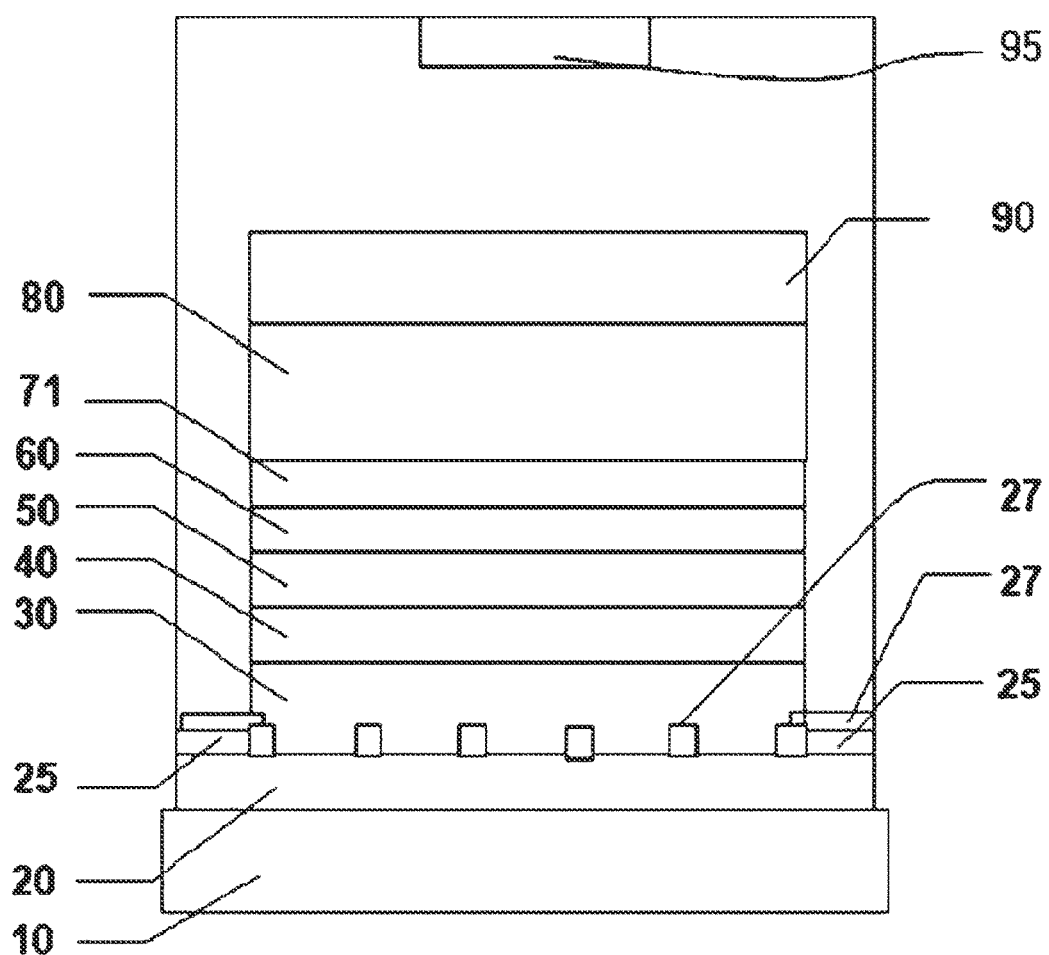
FIG. 3 illustrates the structure of an organic light emitting diode according to an embodiment of the present invention.

The following description is set forth to more specifically explain the organic light emitting diode as illustrated in FIG. 3, but the present invention is not limited thereto.

EXAMPLES

Example

Device Fabrication

1. $Si_xN_y$ is formed to a thickness of 25 nm by sputtering on a soda-lime glass 10 so that Na ions are not diffused into a transparent conductive film.

As a lower electrode 20, a transparent conductive film (ITO) is deposited to a thickness of 50 nm by sputtering thereon, and then an auxiliary electrode 25 composed of Cr and Mo is further deposited.

2. An exposure process is performed to form a pattern for the auxiliary electrode 25. As such, a photoresist (PR) is formed by screen printing, and exposure and etching are performed using an acidic solution as an etchant for Cr and Mo, thus forming the auxiliary electrode 25 at the outer periphery of an emission zone.

3. To form a pattern for an insulating film 27, a material having high electrical insulating properties and viscosity with photosensitivity as in the PR, namely, polyimide, is uniformly applied by spin coating on the upper surface of ITO, after which exposure using an exposure mask, development, and etching are sequentially performed to form a predetermined pattern, thus manufacturing a substrate having an insulating film pattern having a polygonal shape or a curvature.

4. Deposited on the transparent conductive film (ITO) substrate having the insulating film 27 are a hole injection layer (HIL) 30, a hole transport layer (HTL) 40, an emission material layer (EML) 50, an electron transport layer (ETL) 60, an electron injection layer (EIL) and an upper electrode 71 as illustrated in FIG. 3 through the following methods.

Specifically, the ITO glass having the insulating film pattern was placed in a vacuum chamber, a base pressure was set to $1 \times 10^{-7}$ torr, and DNTPD was deposited on ITO, thus forming a hole injection layer having a thickness of 400 Å or 840 Å, on which α-NPB was then deposited, thus forming a hole transport layer in the thickness range of 250~1200 Å. Subsequently, β-ADN as a host and Compound 400 (3 wt %) as a dopant were co-deposited on the hole transport layer, giving an emission material layer 250 Å thick, after which $Alq_3$ was deposited on the emission material layer, giving an electron transport layer 300 Å thick.

Subsequently, a 5 Å thick LiF electron injection layer was formed, and an upper electrode 71 was then formed by depositing MgAg.

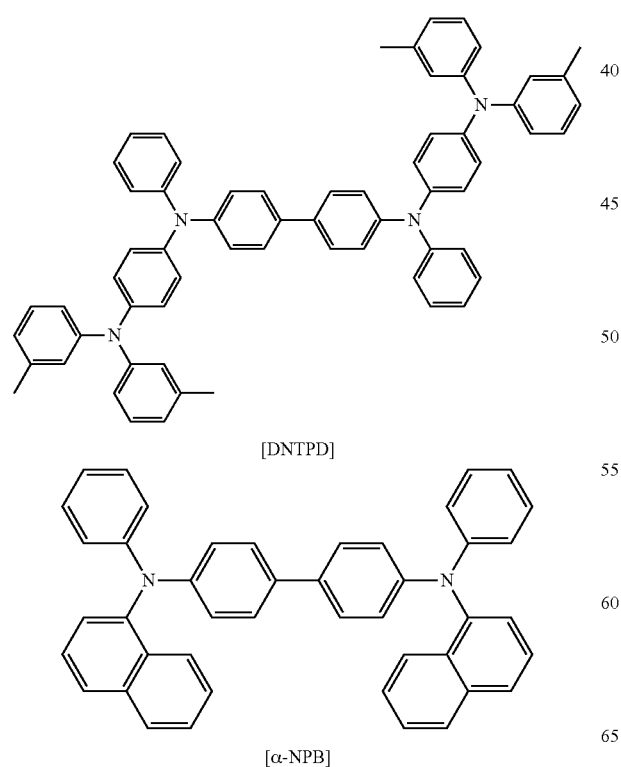

[DNTPD]

[α-NPB]

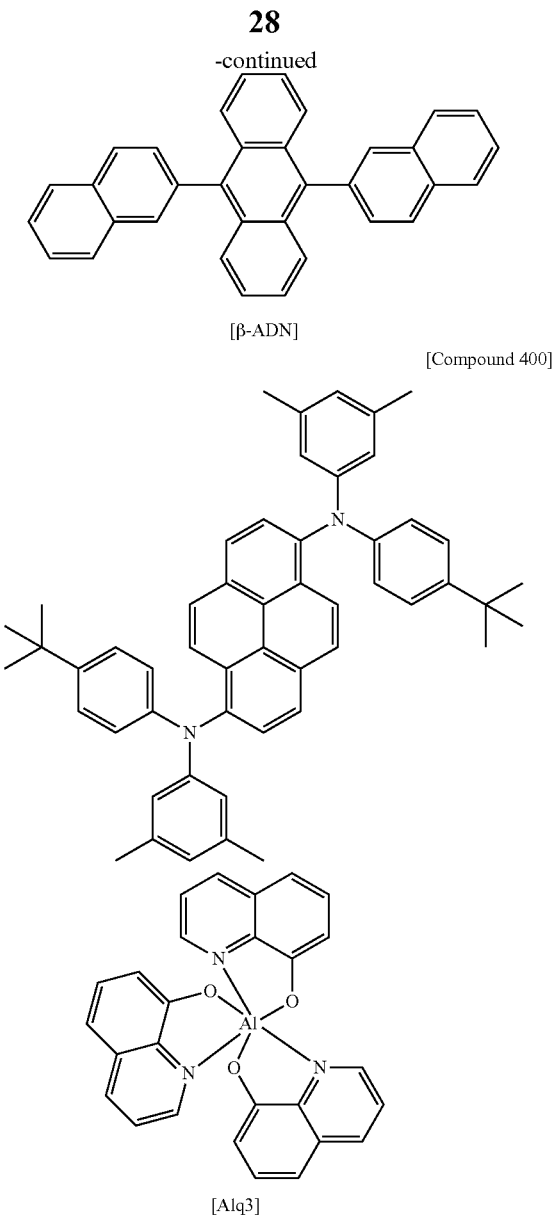

[β-ADN]

[Compound 400]

[Alq3]

The upper electrode 71 was composed of Mg and Ag mixed at a ratio of 9:1 and thus possessed light-transmitting properties, and the formed electrode thickness was 145 Å.

5. A functional layer 80 was formed to a thickness of 100~130 nm using N,N'-diphenyl-N,N'-bis-[4-(phenyl-m-tolyl-amino)-phenyl]-biphenyl-4,4'-diamine (DNTPD) by vacuum thermal deposition, and a reflective layer 90 was formed to a thickness of 100 nm using Al by vacuum deposition, resulting in an organic light emitting diode according to the present invention.

Comparative

Device Fabrication

An organic light emitting diode was manufactured in the same manner as in Example as above, with the exception that the functional layer and the reflective layer according to the present invention were not formed, and Al was used as the cathode responsible for a reflective layer function according to a conventional technique, and each layer thickness was set as shown in Table 1 below.

Evaluation of Device Performance

Figure 4:
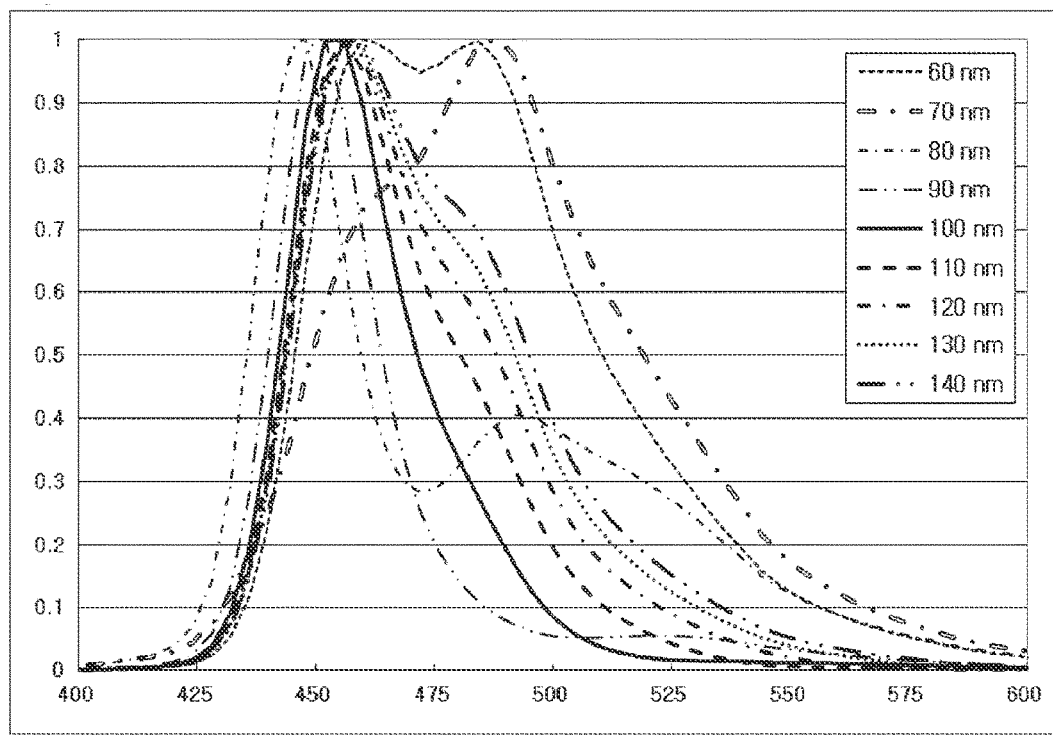
FIG. 4 illustrates the simulation of EL spectrum depending on changes in thickness of the functional layer of the organic light emitting diode according to the present invention.

FIG. 4 illustrates the results of normalization of EL spectrum depending on changes in the thickness of the functional layer according to the present invention. Such results are obtained via optical simulation of an organic light emitting diode according to the present invention in such a manner that changes in the EL spectrum are evaluated by changing the thickness of the functional layer while the layers other than the functional layer are placed under the same conditions.

More specifically, when the thickness of the functional layer is 70 nm, the wavelength corresponding to the maximum intensity is formed near about 500 nm, but when the thickness of the functional layer is increased to 80 nm, the wavelength is shifted to a shorter wavelength. Also, when the thickness of the functional layer is further increased to 100 nm, the wavelength is shifted again to a long wavelength.

Figure 5:
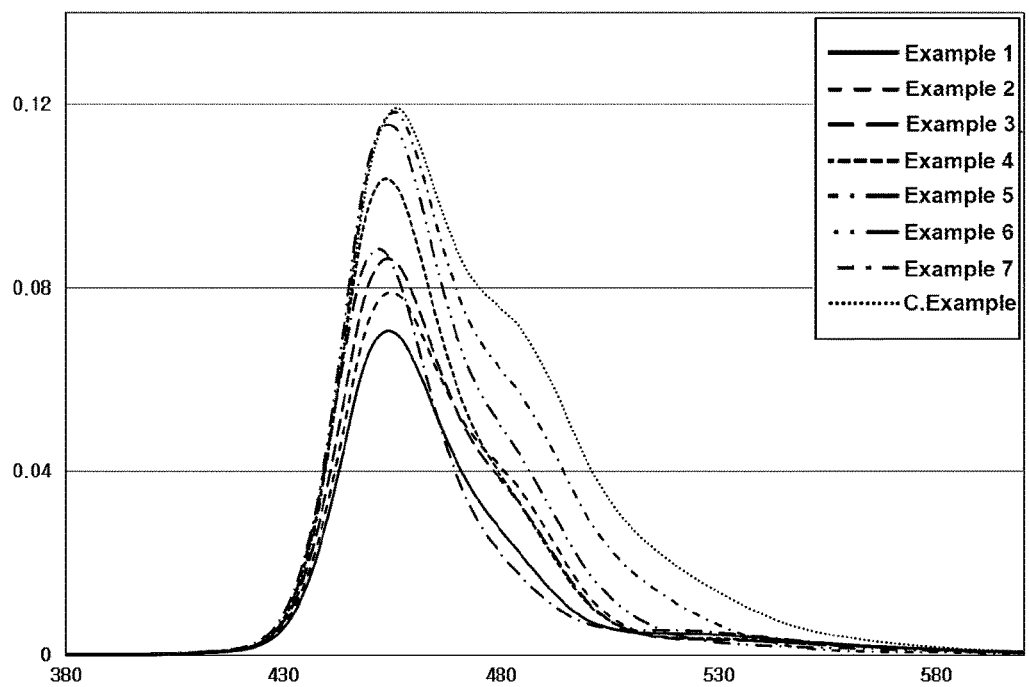
FIG. 5 illustrates the spectrum intensity depending on changes in thickness of the functional layer and the HTL according to an embodiment of the present invention.
Figure 6:
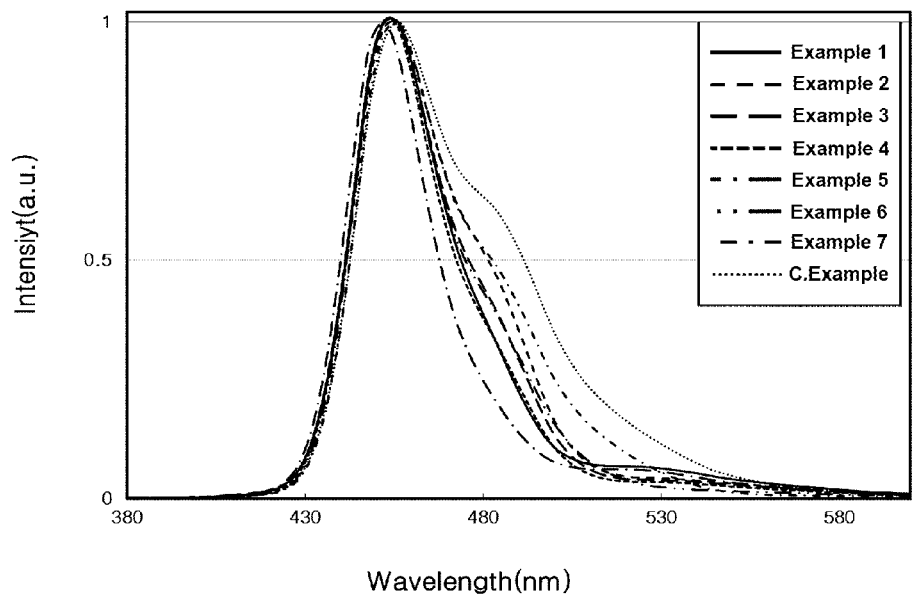
FIG. 6 illustrates the results of normalization of emission properties of the device of FIG. 5.

Table 1 below and FIGS. 5 and 6 show the emission properties of the devices of the examples and the comparative example.

Table 1 below shows the testing results of luminous efficiency and thickness of each layer in the examples and the comparative example. More specifically, the results of Table 1 are obtained by changing the thickness of the hole transport layer in the range of 84~130 nm and changing the thickness of the functional layer in the range of 110~130 nm under the condition that the thicknesses of the hole injection layer (84 nm), the emission material layer (20 nm), and the electron injection layer (30 nm) are fixed. The spectrum of the organic EL device manufactured by the method of Comparative Example as a comparative device (Ref) is shown, and the others are manufactured based on the device structure according to the present invention.

In Example 7, the intensity of the main wavelength in the resonant structure is high but the full width at half maximum of the spectrum becomes wide, thus increasing CIEy.

The emission properties of the organic light emitting diode according to the present invention are described in detail with reference to FIGS. 5 and 6.

FIG. 5 illustrates the intensity of the EL spectrum depending on changes in the thickness of the HTL and the functional layer according to the present invention, without normalization. Referring to FIG. 5, the spectrum intensity is depicted by evaluating device characteristics under the condition that the thicknesses of the HTL (84~130 nm) and the functional layer (100~130 nm) are changed and the thicknesses of the remaining layers are fixed as shown in Table 1.

Also, FIG. 6 illustrates the normalized spectrum based on the results of FIG. 5.

As is apparent from the emission properties of the devices as seen in FIGS. 5 and 6, when the thickness of the functional layer is changed in the range of 110~130 nm (Examples 5, 6, 7), the intensity of the main wavelength of the spectrum is shifted to the wavelength range of 450~456 nm. When the thickness of the functional layer is 120 nm, it can be seen that the intensity of the main wavelength is increased and the full width at half maximum of the EL spectrum is properly decreased. This is considered to be because the wavelength of 460 nm or more is decreased through destructive interference, and also the wavelength of 460 nm or less causes constructive interference, thus enhancing the intensity of the wavelength.

As shown in FIG. 6, when the thickness of the functional layer is increased to 120 nm or more, the full width at half maximum of the spectrum is increased again. This is because destructive interference mainly occurs at the wave-

TABLE 1

| | HIL | HTL | MgAg | Functional layer | Reflective layer | V | Cd/A | lm/W | QE | Cd/m2 | CIEx | CIEy |
|---|---|---|---|---|---|---|---|---|---|---|---|---|
| Ex. 1 | 840 | 840 | 145 | 1000 | 1000 | 3.8 | 2.9 | 2.4 | 3.7 | 293 | 0.25 | 0.087 |
| Ex. 2 | 840 | 840 | 145 | 1100 | 1000 | 3.8 | 3.3 | 2.8 | 4.4 | 330 | 0.74 | 0.084 |
| Ex. 3 | 840 | 1000 | 145 | 1100 | 1000 | 3.8 | 3.2 | 2.7 | 4.5 | 322 | 0.84 | 0.078 |
| Ex. 4 | 840 | 1200 | 145 | 1100 | 1000 | 3.8 | 3.4 | 2.8 | 5 | 340 | 0.94 | 0.072 |
| Ex. 5 | 840 | 1300 | 145 | 1100 | 1000 | 4 | 3 | 2.4 | 4.1 | 300 | 0.45 | 0.076 |
| Ex. 6 | 840 | 1200 | 145 | 1200 | 1000 | 3.8 | 3.8 | 3.1 | 5.7 | 383 | 0.44 | 0.072 |
| Ex. 7 | 840 | 1200 | 145 | 1300 | 1000 | 3.8 | 5.3 | 4.4 | 6.6 | 529 | 0.83 | 0.092 |
| C. Ex. | 400 | 250 | X | X | 1000 | 3.8 | 8.2 | 6.7 | 7.9 | 816 | 0.93 | 0.128 |

As such, HIL indicates a hole injection layer, HTL indicates a hole transport layer, MgAg indicates an upper electrode, and V indicates a voltage applied to both ends. The testing was carried out at 10 mA/cm$^2$.

As is apparent from the results of Table 1, when the HTL and the functional layer are adjusted in thickness, the lowest CIEy may be obtained. More specifically, when the HTL is 120 nm thick and the functional layer is 120 nm thick in Table 1, the lowest CIEy can be confirmed to result.

Also, when comparing Examples 4 and 5 as seen in Table 1, the color coordinate value CIEy is increased again when the HTL is about 120 nm thick. Specifically, when the HTL has a thickness of 120 nm, the full width at half maximum is appropriately small, and the lowest CIEy is manifested. Thereby, the maximum resonance effect is exhibited at a main wavelength of 455 nm, and the spectrum intensity becomes optimal (Example 6). In Example 5, the full width at half maximum is small, but the spectrum resonating at the wavelength of 480 nm or more is generated, thus increasing CIEy.

length of 460 nm or less and constructive interference takes place at the wavelength of 460 nm or more.

In the spectrum of FIG. 6, when the HTL and the functional layer are 120 nm thick (Example 6), the intensity of the wavelength of 470 nm or more is decreased and simultaneously the intensity of the wavelength of 455 nm exhibits optimal resonance.

This is to demonstrate that when the HTL and the functional layer are 120 nm thick, the intensity of the wavelength of 460 nm easily causes constructive interference and is thus strengthened, and the wavelength of 470 nm or more undergoes destructive interference. Thereby, the thickness of the functional layer may be determined to be 120 nm in terms of affording the resonant structure having optimal color coordinates and wavelength intensity by enhancing the intensity of 455 nm and decreasing the intensity of the wavelength of 470 nm or more using the thickness of the functional layer.

The above results show the device characteristics under the condition that the thicknesses of the hole injection layer, hole transport layer, emission material layer, and electron injection layer are fixed. If the thickness of the other layer is changed, the thickness of the HTL and the functional layer for the optimal resonant structure may not be 120 nm but may be differently set.

Figure 7:
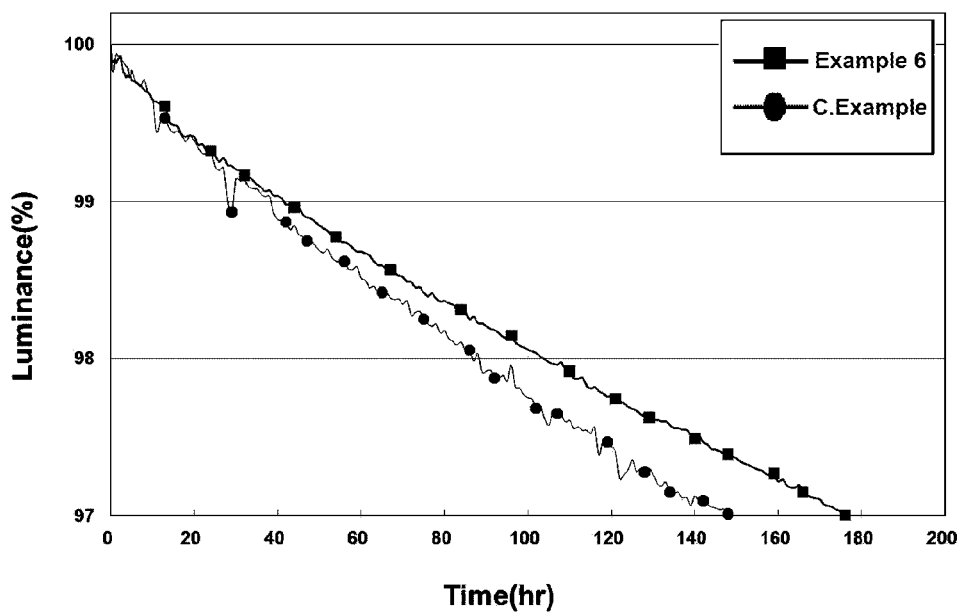
FIG. 7 illustrates the lifetime of the organic light emitting diode manufactured by the present invention.

The results of lifetime of the organic light emitting diode according to the present invention are shown in FIG. 7. More specifically, FIG. 7 is a graph illustrating the lifetime of the device (Example 6) using the HTL and the functional layer at a thickness of 120 nm and the lifetime of the conventional device (Comparative Example).

When comparing the lifetime (quadrangle) of the device of Example 6 with the lifetime (circle) of the device of Comparative Example, T97 (a period of time required from an initial luminance to a 3% reduction) of Example 6 was 180 hr, and T97 of Comparative Example was 150 hr. As such, the initial luminance of Example 6 and Comparative Example for measurement of the lifetime was 1500 cd/m$^2$.

Therefore, the lifetime of Example 6 is equal to or more than that of the device manufactured by the method of Comparative Example, thus achieving longer lifetime of the device of the invention.

INDUSTRIAL APPLICABILITY

According to the present invention, an organic light emitting diode having high color quality, high luminance, long lifetime, and high efficiency can be manufactured. Such an organic light emitting diode has a device structure that has a simple manufacturing process and also that facilitates the fabrication of a large-area device, with high color reproducibility.

The invention claimed is:
1. An organic light emitting diode, comprising:
a lower electrode formed on a light-transmitting substrate;
an organic thin film layer formed on the lower electrode and including an emission material layer;
a light-transmitting upper electrode formed on the organic thin film layer;
a functional layer formed on the upper electrode and enabling mutual reinforcement and interference of transmitted light; and
a reflective layer formed on the functional layer;
wherein the emission material layer emits light by combination of a host and a dopant; and
the host comprises at least one anthracene derivative represented by Formula 1A below:

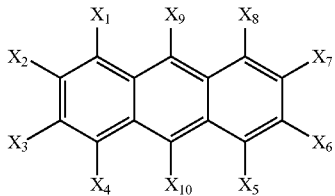

[Formula 1A]

in Formula 1A, $X_1$ to $X_{10}$ are identical to or different from each other, and are each independently selected from among a hydrogen atom, a deuterium atom, a substituted or unsubstituted C1-C30 alkyl group, a substituted or unsubstituted C2-C30 alkenyl group, a substituted or unsubstituted C3-C30 cycloalkyl group, a substituted or unsubstituted C5-C30 cycloalkenyl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted C1-C30 alkylamine group, a substituted or unsubstituted C5-C30 arylamine group, a substituted or unsubstituted C5-C50 aryl group, a substituted or unsubstituted C3-C50 heteroaryl group containing O, N or S as a heteroatom, a substituted or unsubstituted silicon group, a substituted or unsubstituted boron group, a substituted or unsubstituted silane group, a carbonyl group, a phosphoryl group, an amino group, a nitrile group, a hydroxyl group, a nitro group, a halogen group, an amide group, or an ester group, and $X_1$ to $X_{10}$ are able to form an aliphatic, aromatic, aliphatic hetero, or aromatic hetero fused ring with an adjacent group.

2. The organic light emitting diode of claim 1, further comprising an auxiliary electrode formed on an edge of the lower electrode.

3. The organic light emitting diode of claim 1, wherein the lower electrode is a conductive transparent electrode, and has a thickness of 1 to 1000 nm.

4. The organic light emitting diode of claim 1, wherein the upper electrode has a transmittance of 10% or more, and a resistance ranging from 0.1 mΩ to 500 Ω.

5. The organic light emitting diode of claim 1, wherein the upper electrode has a thickness of 1 to 1000 nm; and
a material for the upper electrode comprises copper, chromium, molybdenum, nickel, aluminum, magnesium, silver, gold, platinum, indium tin oxide (ITO), indium zinc oxide (IZO), zinc oxide (ZnO), ZnO/Ga$_2$O$_3$, ZnO/Al$_2$O$_3$, sodium, a sodium-potassium alloy, cesium, lithium, a magnesium-silver alloy, aluminum oxide, an aluminum-lithium alloy, indium, a rare earth metal, mixtures thereof with a material for an organic light emitting medium, or mixtures thereof with an electron injection material, which are used alone or in combination of two or more.

6. The organic light emitting diode of claim 1, wherein the functional layer has a refractive index of 0.1 to 10, and a thickness of 1 to 1000 nm.

7. The organic light emitting diode of claim 1, wherein the functional layer comprises an inorganic material, an organic material, or a combination thereof, the inorganic material includes metal oxide or metal nitride, and the organic material is selected from among a conductive organic material, a polymer compound, a mixture of a conductive organic compound and a polymer compound, a hole injection material, a hole transport material, an electron transport material, a host material, or a dopant material.

8. The organic light emitting diode of claim 1, wherein a thickness of the functional layer or the light-transmitting upper electrode is adjusted, thereby controlling mutual reinforcement and interference of light emitted from the organic light emitting diode.

9. The organic light emitting diode of claim 1, wherein the reflective layer has a reflectance of 20% or more.

10. The organic light emitting diode of claim 1, wherein the reflective layer comprises any one or a combination of two or more selected from among aluminum, magnesium, silver, gold, platinum, chromium, cobalt, tungsten, calcium, lithium, or sodium, and has a thickness of 1 to 5000 nm.

11. The organic light emitting diode of claim 1, wherein the organic thin film layer comprises at least one selected from among a hole injection layer, a hole transport layer, an electron blocking layer, a layer having both a hole injection function and a hole transport function, an emission material layer, a hole blocking layer, an electron transport layer, or an electron injection layer.

12. The organic light emitting diode of claim 11, wherein mutual reinforcement and interference of light are controlled by changing a thickness of at least one selected from among the hole injection layer, the hole transport layer, the electron blocking layer, the layer having both a hole injection function and a hole transport function, the emission material layer, the hole blocking layer, the electron transport layer, or the electron injection layer, which are included in the organic thin film layer.

13. The organic light emitting diode of claim 1, wherein the dopant comprises at least one compound represented by Formula 2 or Formula 3 below:

[Formula 2]

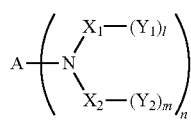

[Formula 3]

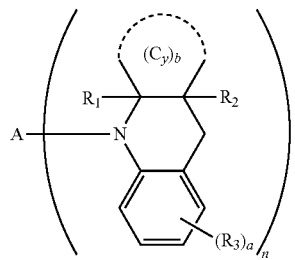

in Formula 2 and Formula 3,

A is, as an aromatic ring group having no heteroatom, a substituted or unsubstituted C6-C50 aromatic ring group, or is, as an aromatic hetero ring group having a heteroatom including O, N or S, a substituted or unsubstituted C2-C50 aromatic hetero ring group; and when n is 2 or more, amine groups linked to A are identical to or different from each other, in Formula 2, $X_1$ and $X_2$ are identical to or different from each other, and $X_1$ and $X_2$ are each independently selected from among a substituted or unsubstituted C6-C30 arylene group or a single bond, and $X_1$ and $X_2$ may be linked to each other;

$Y_1$ and $Y_2$ are identical to or different from each other, and are each independently selected from among a substituted or unsubstituted C6-C24 aryl group, a substituted or unsubstituted C2-C24 heteroaryl group, a substituted or unsubstituted C1-C24 alkyl group, a substituted or unsubstituted C1-C24 heteroalkyl group, a substituted or unsubstituted C3-C24 cycloalkyl group, a substituted or unsubstituted C1-C24 alkoxy group, a cyano group, a halogen group, a substituted or unsubstituted C6-C24 aryloxy group, a substituted or unsubstituted C1-C40 alkylsilyl group, a substituted or unsubstituted C6-C30 arylsilyl group, deuterium, or hydrogen, and are able to form an aliphatic, aromatic, aliphatic hetero or aromatic hetero fused ring, with an adjacent group; and l and m are each an integer of 1 to 20, and n is an integer of 1 to 4, and in Formula 3, $C_y$ is a substituted or unsubstituted C3-C8 cycloalkyl;

b is an integer of 1 to 4, and when b is 2 or more, individual cycloalkanes are provided in a fused form, and substituted hydrogens are substituted with deuterium or alkyl and are identical to or different from each other, B is a single bond or $-[C(R_5)(R_6)]_p-$, and p is an integer of 1 to 3, and when p is 2 or more, two or more $R_5$ and $R_6$ groups are identical to or different from each other;

$R_1$, $R_2$, $R_3$, $R_5$ and $R_6$ are identical to or different from each other, and are each independently selected from among hydrogen, deuterium, a halogen atom, a hydroxyl group, a cyano group, a nitro group, an amino group, an amidino group, hydrazine, hydrazone, a carboxyl group or salts thereof, sulfonic acid or salts thereof, phosphoric acid or salts thereof, a substituted or unsubstituted C1-C60 alkyl group, a substituted or unsubstituted C2-C60 alkenyl group, a substituted or unsubstituted C2-C60 alkynyl group, a substituted or unsubstituted C1-C60 alkoxy group, a substituted or unsubstituted C1-C60 alkylthio group, a substituted or unsubstituted C3-C60 cycloalkyl group, a substituted or unsubstituted C6-C60 aryl group, a substituted or unsubstituted C5-C60 aryloxy group, a substituted or unsubstituted C5-C60 arylthio group, a substituted or unsubstituted C2-C60 heteroaryl group, a substituted or unsubstituted C1-C60(alkyl)amino group, a di(substituted or unsubstituted C1-C60 alkyl)amino group, a (substituted or unsubstituted C6-C60 aryl)amino group, a di(substituted or unsubstituted C6-C60 aryl)amino group, a substituted or unsubstituted C1-C40 alkylsilyl group, or a substituted or unsubstituted C6-C30 arylsilyl group, and a is an integer of 1 to 4, and when a is 2 or more, two or more $R_3$ groups are identical to or different from each other, and when a plurality of $R_3$ groups is provided, individual $R_3$ groups are optionally in a fused form, and n is an integer of 1 to 4.

14. The organic light emitting diode of claim 1, wherein the reflective layer or the functional layer is connected to the light-transmitting upper electrode by ohmic contact so as to reduce a resistance of the light-transmitting upper electrode.

15. The organic light emitting diode of claim 1, further comprising a capping layer formed between the lower electrode and the substrate or on an outer surface of the substrate to prevent total reflection of light, thereby increasing luminous efficiency of an organic emission material.

16. The organic light emitting diode of claim 1, wherein the organic light emitting diode comprises a blue emission material, a green emission material, or a red emission material, which emits light in a wavelength range of 380 to 800 nm, and the blue emission material, the green emission material, or the red emission material is a fluorescent material or a phosphorescent material.

17. A method of manufacturing an organic light emitting diode, comprising:
    forming a lower electrode on a light-transmitting substrate;
    forming an organic thin film layer including an emission material layer on the lower electrode;
    forming a light-transmitting upper electrode on the organic thin film layer;
    forming a functional layer that enables mutual reinforcement and interference of transmitted light on the upper electrode; and
    forming a reflective layer on the functional layer,
    wherein the emission material layer includes an organic emission material comprised of a host and a dopant; and the host comprises at least one anthracene derivative represented by Formula 1A below:

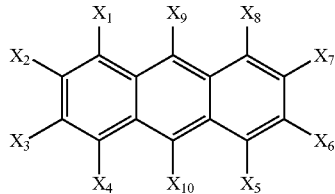

[Formula 1A]

in Formula 1A, $X_1$ to $X_{10}$ are identical to or different from each other, and are each independently selected from among a hydrogen atom, a deuterium atom, a substituted or unsubstituted C1-C30 alkyl group, a substituted or unsubstituted C2-C30 alkenyl group, a substituted or unsubstituted C3-C30 cycloalkyl group, a substituted or unsubstituted C5-C30 cycloalkenyl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted C1-C30 alkylamine group, a substituted or unsubstituted C5-C30 arylamine group, a substituted or unsubstituted C5-C50 aryl group, a substituted or unsubstituted C3-C50 heteroaryl group containing O, N or S as a heteroatom, a substituted or unsubstituted silicon group, a substituted or unsubstituted boron group, a substituted or unsubstituted silane group, a carbonyl group, a phosphoryl group, an amino group, a nitrile group, a hydroxyl group, a nitro group, a halogen group, an amide group, and an ester group, and $X_1$ and $X_{10}$ are able to form an aliphatic, aromatic, aliphatic hetero, or aromatic hetero fused ring with an adjacent group.

18. The method of claim 17, wherein a thickness of the functional layer or the light-transmitting upper electrode is adjusted, thereby controlling mutual reinforcement and interference of light emitted from the organic light emitting diode.

19. The method of claim 17, wherein the organic thin film layer comprises at least one selected from among a hole injection layer, a hole transport layer, an electron blocking layer, a functional layer having both a hole injection function and a hole transport function, an emission material layer, a hole blocking layer, an electron transport layer, or an electron injection layer.

20. The method of claim 19, wherein mutual reinforcement and interference of light emitted from the organic light emitting diode are controlled by adjusting a thickness of at least one selected from among the hole injection layer, the hole transport layer, the electron blocking layer, the layer having both a hole injection function and a hole transport function, the emission material layer, the hole blocking layer, the electron transport layer, or the electron injection layer, which are included in the organic thin film layer.

21. The method of claim 17, wherein the functional layer comprises any one or a combination of an inorganic material including metal oxide or metal nitride; and an organic material selected from among a conductive organic material, a polymer compound, a mixture of a conductive organic compound and a polymer compound, a hole injection material, a hole transport material, an electron transport material, a host material, or a dopant material.

22. The method of claim 17, wherein at least one selected from among the lower electrode, the organic thin film layer, the hole injection layer, the hole transport layer, the electron blocking layer, the functional layer having both a hole injection function and a hole transport function, the emission material layer, the hole blocking layer, the electron transport layer, the electron injection layer, the light-transmitting upper electrode, the functional layer, or the reflective layer is formed by a deposition process or a solution process.

23. An electronic device comprising the organic light emitting diode of claim 1, wherein the electronic device is selected from among a flat panel display, a flexible display, a solid color or white flat panel illuminator, or a solid color or white flexible illuminator.

* * * * *